(12) United States Patent
Matsumoto et al.

(10) Patent No.: US 6,844,957 B2
(45) Date of Patent: Jan. 18, 2005

(54) THREE LEVEL STACKED REFLECTIVE DISPLAY

(75) Inventors: Keiji Matsumoto, Yokohama (JP); Lubomyr Taras Romankiw, Briarcliff Manor, NY (US); Kuniaki Sueoka, Sagamihara (JP); Yoichi Taira, Tokyo (JP); Keizoh Takeda, Yamato (JP)

(73) Assignee: International Business Machines Corporation, Armonk, NY (US)

( * ) Notice: Subject to any disclaimer, the term of this patent is extended or adjusted under 35 U.S.C. 154(b) by 198 days.

(21) Appl. No.: 09/996,836

(22) Filed: Nov. 29, 2001

(65) Prior Publication Data

US 2003/0043316 A1 Mar. 6, 2003

Related U.S. Application Data

(60) Provisional application No. 60/253,833, filed on Nov. 29, 2000.

(51) Int. Cl.[7] .................... G02B 26/00; G02F 1/1347
(52) U.S. Cl. .......................... 359/296; 349/74
(58) Field of Search ............... 349/73, 74, 77, 349/78, 84, 106, 139; 359/296; 345/92

(56) References Cited

U.S. PATENT DOCUMENTS 5,625,474 A * 4/1997 Aomori et al. ............... 349/79
5,707,745 A * 1/1998 Forrest et al. ............... 428/432
5,712,695 A * 1/1998 Tanaka et al. ................ 349/79
5,995,188 A * 11/1999 Shimizu et al. ............. 349/147

* cited by examiner

Primary Examiner—Georgia Epps
Assistant Examiner—William Choi
(74) Attorney, Agent, or Firm—Scully, Scott, Murphy & Presser; Robert M. Trepp, Esq.

(57) ABSTRACT

A structure and fabrication technology for a reflective, ambient light, low cost display is described incorporating a plurality of cells laid out side by side and stacked as many as three levels on top of each other. Each stack of three cells being driven by an array of TFT's positioned on the bottom layer. Each cell comprises a light transmitting front window, three levels of individual cells RGB (Red, Green, and Blue) stacked on top of each other, each level having its own individual electrode, each electrode being connected by vertical conducting via holes running through each transparent dielectric spacert and being connected to a individual TFT. The bottom panel having a reflective surface so as to provide maximum reflectivity of the ambient light. Placed under the reflective surface is an array of TFT's which provide the electrical impulses necessary to set each individual potential in each vertically stacked cell with respect to ground potential. A transmissive liquid crystal display can readily be fabricated by deleting the reflective surface. Also described are structures and assembly methods suitable for fabricating a Guest-Host LCD, a Cholesteric LCD, a Holographic Polymer Dispersed LCD and an Organic Light Emitting Diode (OLED) display.

11 Claims, 25 Drawing Sheets

(1) Unit cell size 350μm
(2) Unit cell size 250μm
(3) Unit cell size 300μm
(4) Unit cell size 400μm Top Cover Plate - Top View

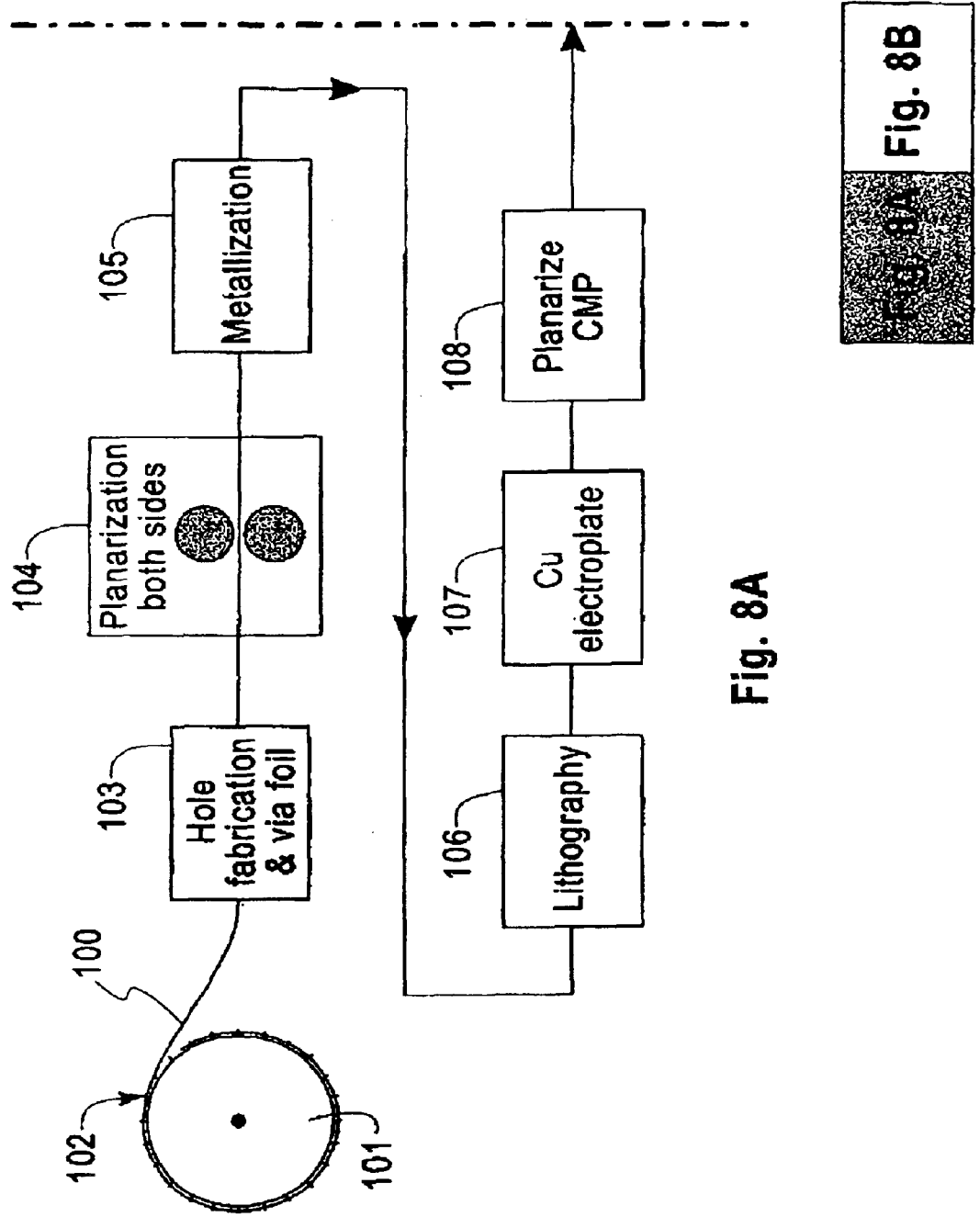

Via making by photo etching

Sputtering ITO and patterning

Vertical electrode by copper plating

Polyimide coat and patterning (Printing)

One Pixel

US 6,844,957 B2

THREE LEVEL STACKED REFLECTIVE DISPLAY

This application claims a benefit of 60/253,833 filed on Nov. 29, 2000.

FIELD OF THE INVENTION

This invention relates to reflective and transmissive liquid crystal displays, to electrophoretic displays and to Organic Light Emitting Diode (OLED) displays and more particularly, to an array of pixels where each pixel exists as three color cells stacked above one another driven by an array of thin film transistors positioned below the stacked color cells.

BACKGROUND OF THE INVENTION

In a typical liquid crystal (LC) display the three color cells: Red, Green and Blue (RGB) are placed side by side with respect to each other and are covered by a polarizer. The RGB color filter in LC displays use almost one third (⅓) of the incident light. To achieve high brightness and resolution the LC display requires back lighting. The back lighting consumes a considerable amount of energy and rapidly drains the battery of a portable device. The reflected ambient light display with individual color cells stacked on top of each other is capable of much higher pixel density per square inch than a conventional LC display. Thus, in principle, the pixel density per unit area could be much higher than what it is for the LC horizontally placed color cell pixel display and the energy and cost of operating such a display would be much smaller.

Many attempts were made to build a three level, three color reflective display. In such a display the pixels have to be placed (stacked) on top of each other rather than side by side as is the case in a typical LC display. In U.S. Pat. No. 5,796,447 which issued Aug. 18, 1998 to Okumura et al., a liquid crystal display is described having each pixel formed by a plurality of liquid crystal layers and a plurality of transparent electrodes which are alternately stacked on a first electode functioning as a reflecting plate to display a plurality of different colors.

The most difficult part in building such a vertically stacked color cell reflective display is providing the vertical electrical connections between the electrodes at individual levels in each pixel and the respective TFT on the substrate below.

SUMMARY OF THE INVENTION

In accordance with the present invention, a structure and fabrication technology for a reflective, ambient light, low cost display is described comprising a plurality of pixels laid out side by side with stacked color cells such as three levels on top of each other forming a pixel. Each stack of three color cells being driven by an array of TFT's positioned on the bottom layer. Each pixel comprises a light transmitting front dielectric window, three levels of individual cells RGB (Red, Green, and Blue) stacked on top of each other, each level having its own individual electrode, each electrode being connected by a vertical electrode running through another cell and having sealed conducting via holes running through each transparent dielectric window and being connected to an individual TFT. The bottom panel having a reflective surface so as to provide maximum reflectivity of the ambient light. Placed under the reflective surface is an array of TFT's which provide the electrical impulses necessary to set each individual potential in each vertically stacked cell with respect to a ground potential. A transmissive liquid crystal display can readily be fabricated by deleting the reflective surface.

The invention further provides a cell with electrode configurations for either electrophoretic material, liquid crystal material or Organic Light Emitting Diode (OLED) display.

The invention further provides structures and assembly methods suitable for fabricating a Guest-Host LCD, a Cholesteric LCD, a Holographic Polymer Dispersed LCD and an Organic Light Emitting Diode (OLED) display.

BRIEF DESCRIPTION OF THE DRAWING

These and other features, objects, and advantages of the present invention will become apparent upon consideration of the following detailed description of the invention when read in conjunction with the drawing in which.

DESCRIPTION OF THE PREFERRED EMBODIMENTS

Figure 1A:
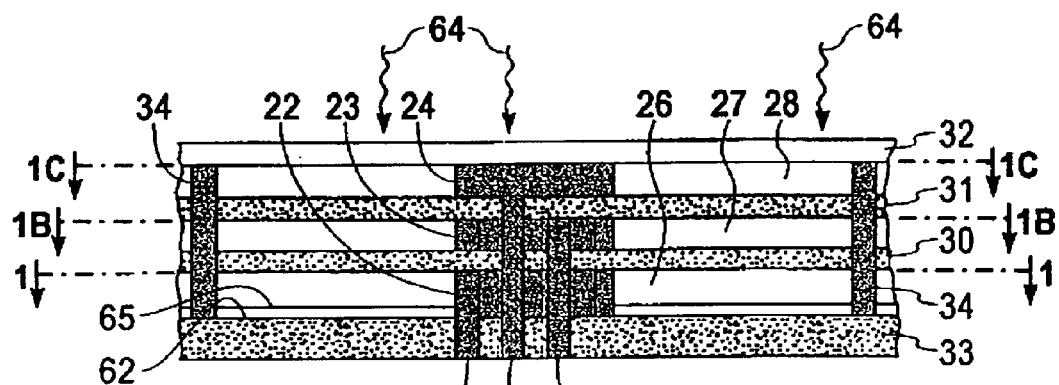
FIG. 1A is a cross section view along the line 1A—1A of FIG. 1.
Figure 1:
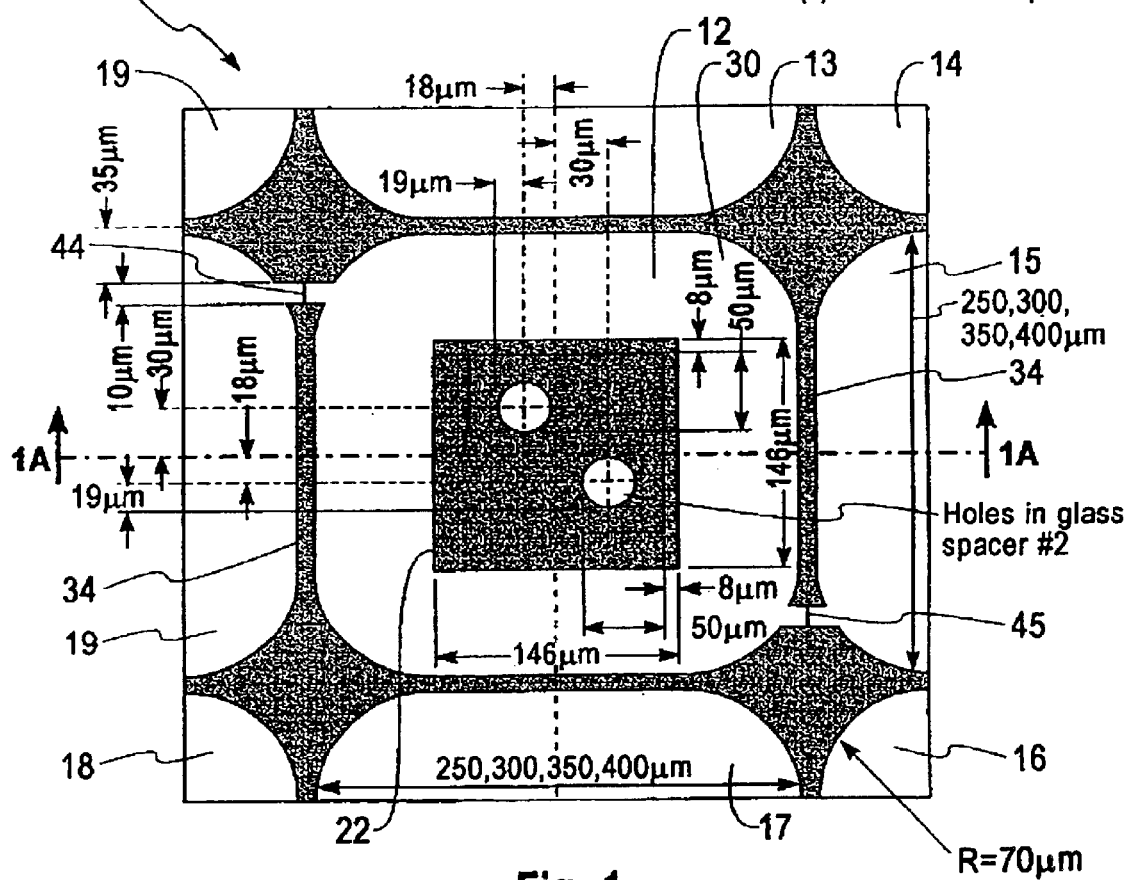
FIG. 1 is a schematic top view of a first embodiment of the invention of the first color cell.
Figure 1B:
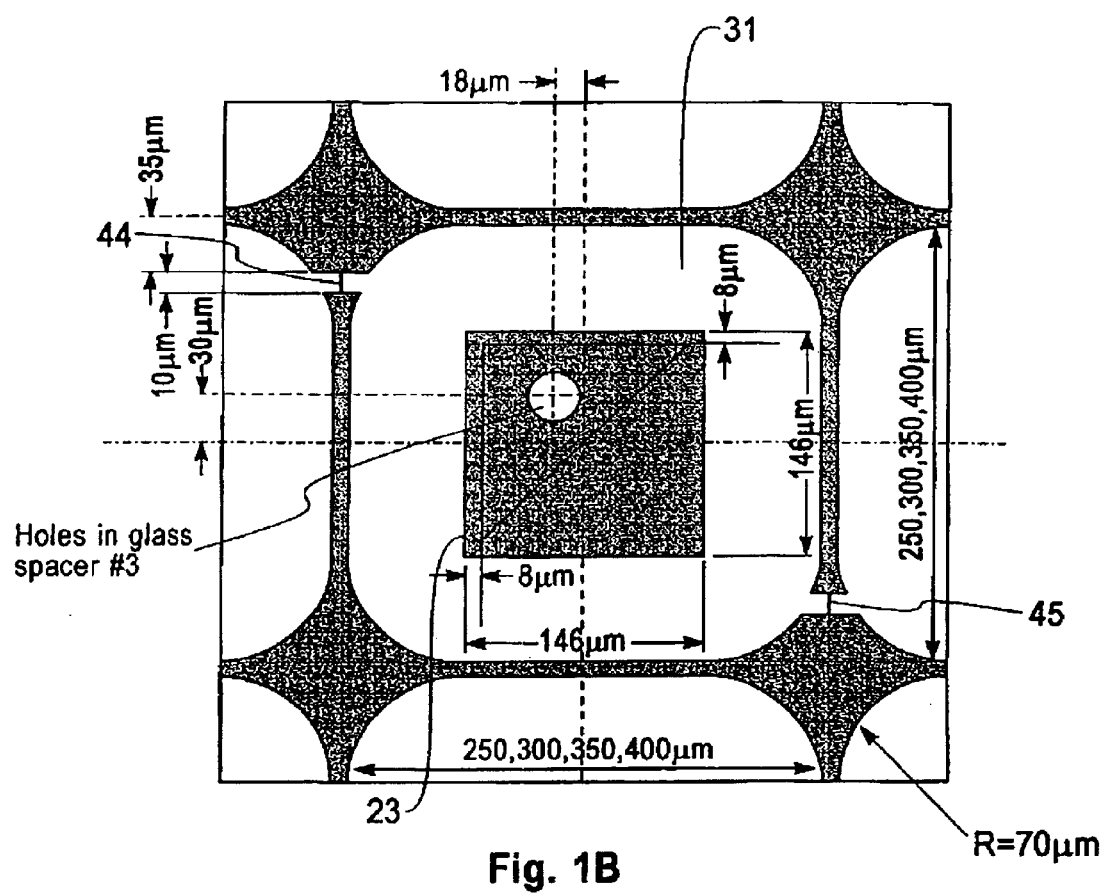
FIG. 1B is a schematic top view of a first embodiment of the invention of the second stacked color cell.
Figure 1C:
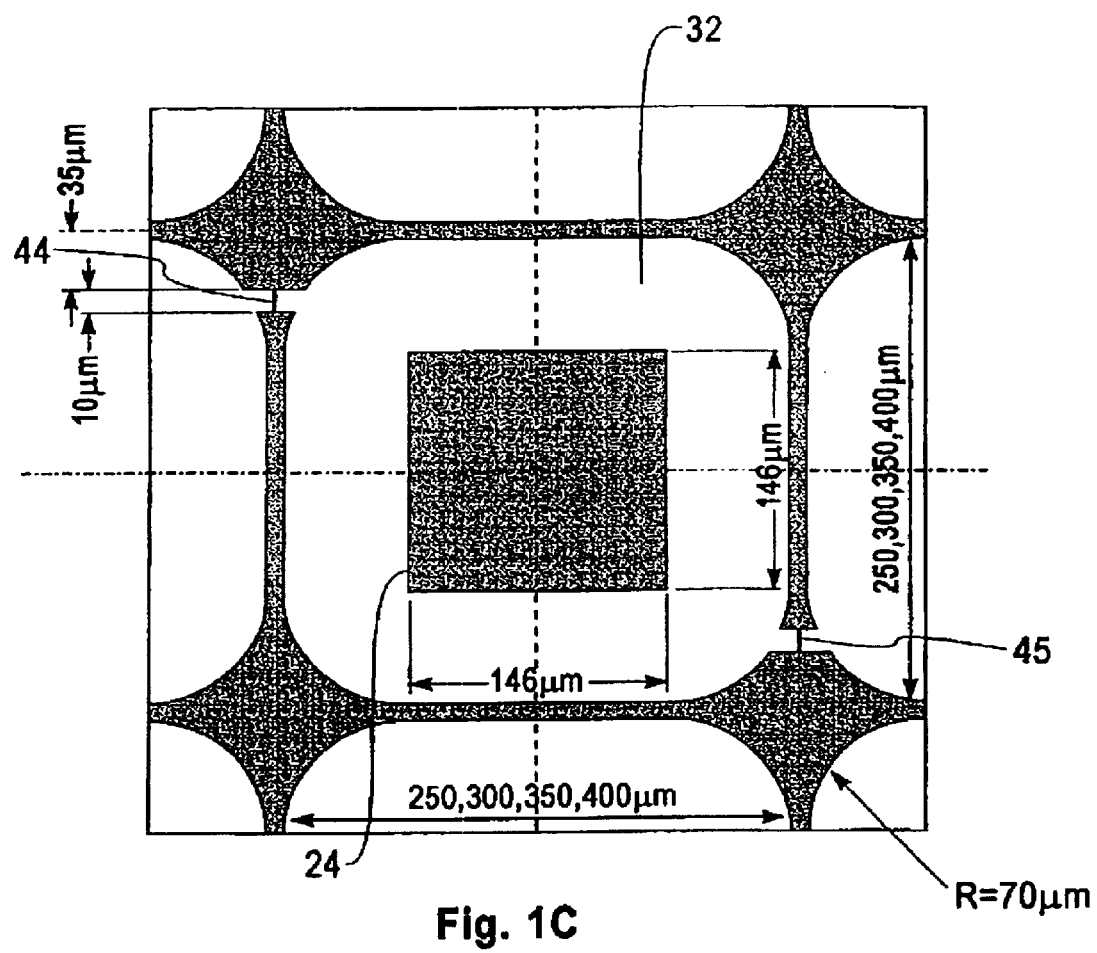
FIG. 1C is a schematic top view of a first embodiment of the invention of the third stacked color cell.
Figure 1D:
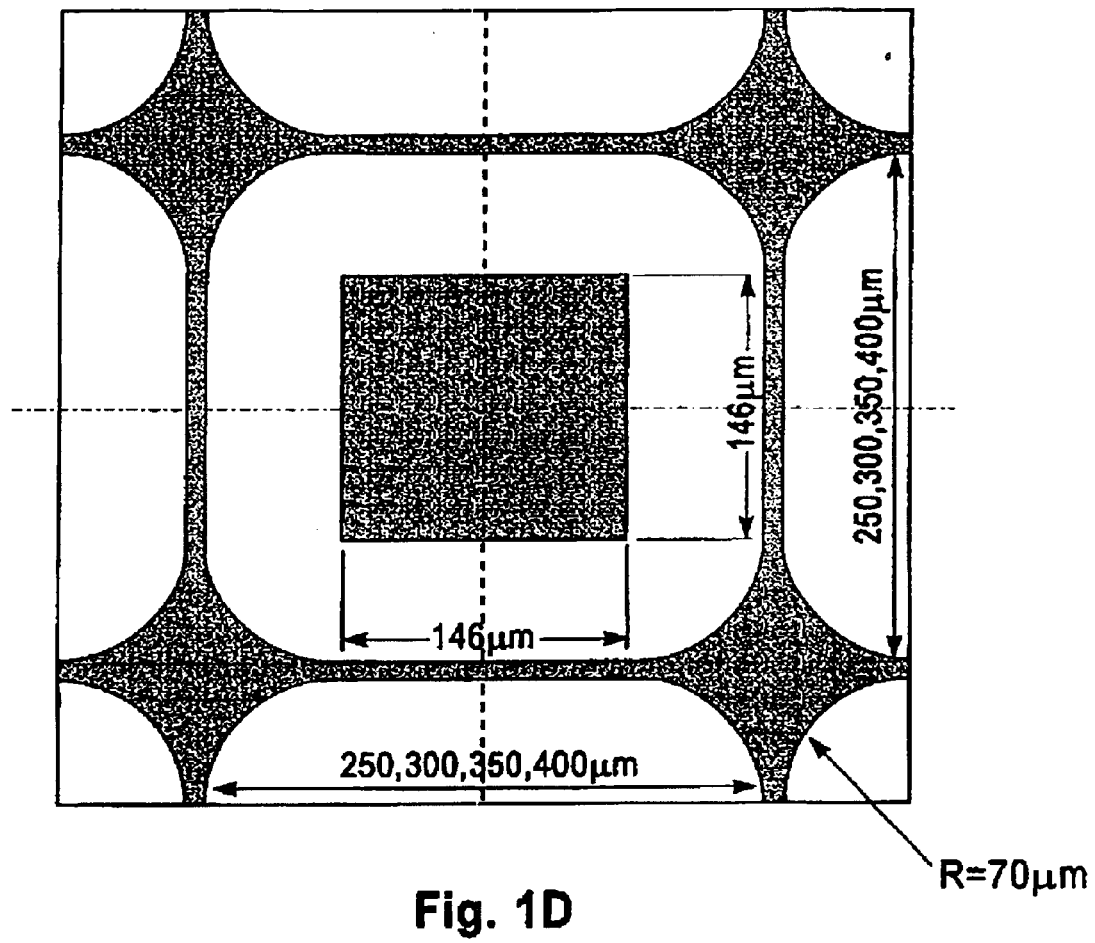
FIG. 1D is a schematic top view of a first embodiment of the invention of the top cover of the cell.

This invention describes several different three level embodiments for a color reflective display and the processes and techniques to fabricate such structures. One such embodiment is shown in FIGS. 1, 1A–1D. FIGS. 1, 1B, 1C and 1D show a cross section top view of FIG. 1A of electrodes in a stacked electrophoretic reflective display 10. Electrophoretic reflective display 10 has stacked cells 12–20 which may have the same internal structure. Stacked cells 13–20 surround and are adjacent to stacked cell 12. FIG. 1A shows a cross section view along the line 1A—1A of FIG. 1. FIG. 1 shows a cross section view along the line 1—1 of FIG. 1A. FIG. 1B shows a cross section view along the line 1B—1B of FIG. 1A. FIG. 1C shows a cross section view along the line 1C—1C of FIG. 1A. FIG. 1D shows a cross section view along the line 1D—1D of FIG. 1A.

FIG. 1A shows electrodes 22–24 for respective electrophoretic layers 26–28. Electrophoretic layers 26 and 27 are separated by glass spacer 30. Electrophoretic layers 27 and 28 are separated by glass spacer 31. Cover glass 32 is above electrophoretic layer 28. A wall electrode 34 extends vertically between glass spacer 33 and cover glass 32 and follows path to define the exterior of stacked cell 12. Wall electrode 34 is usually at ground potential surrounds at a distance from electrodes 22–24. A glass spacer 33 is below electrophoretic layer 26. Vertical electrodes 38–40 function to connect a potential to electrodes 22–24 to place an electric field between the respective electrode and wall electrode 34. The potential for electrodes 22–24 determine the color of the cell when viewed. The potential is generated by thin film transistors positioned (not shown) below glass spacer 33. Electrodes 39 and 40 are insulated from electrode 22 by for example a glass insulator.

FIGS. 1, 1B and 1C show openings 44 and 45 in wall electrode 34 to permit filling of the spaces between glass spacers 31–33 and cover glass 32 with electrophoretic material forming electrophoretic layers 26–28.

Figure 2:
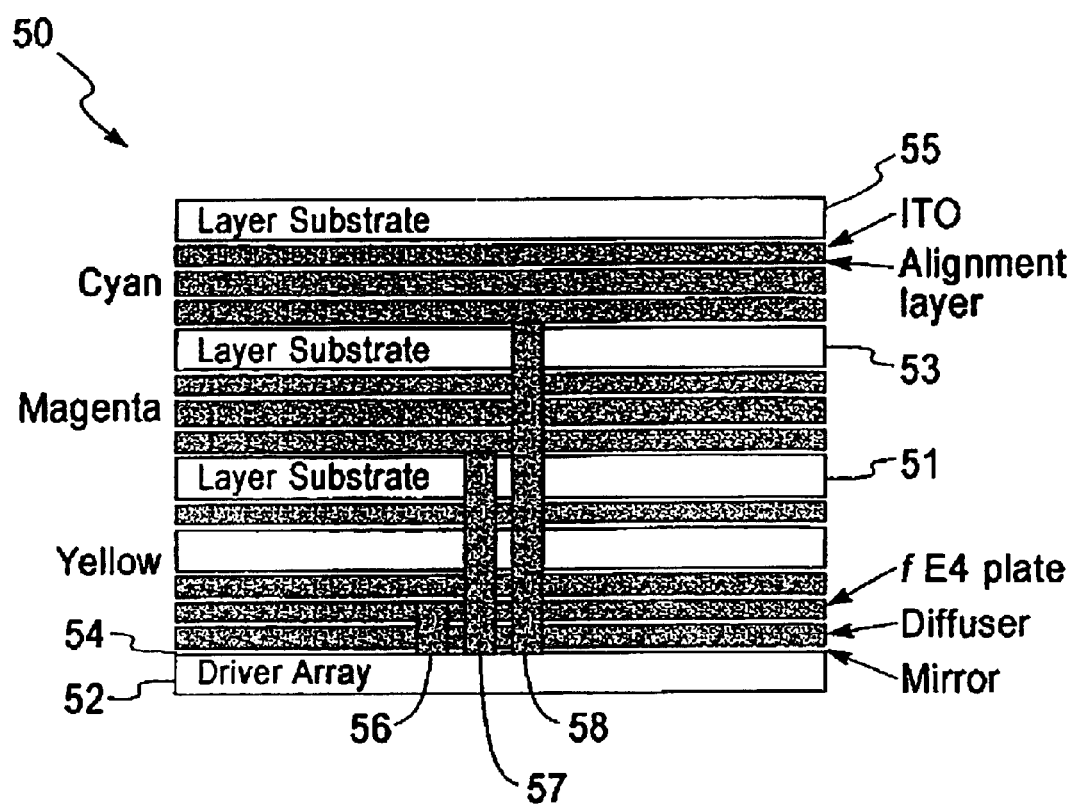
FIG. 2 is a schematic cross section view of second embodiment of the invention.

A second embodiment of the invention is shown in FIG. 2. FIG. 2 shows a Guest-Host Liquid Crystal (LC) reflective or transmisive display 50. Reflective display 50 consists of a bottom layer 52 which carries the Thin Film Transistors (TFT's) (not shown). These transistors are fabricated by conventional means. The TFT bearing bottom layer has a dielectric insulator layer 54 on it. The dielectric insulator 54 has vias 56–58 which are filled with metal. Each metal via 56–58 is contacting a respective transistor which controls the potential on a respective level of the pixel. The metal is selected from the group of conductors such as Cu, Ni, Mo, Ag, Au, etc. The bottom layer 52 bearing the TFT's, the dielectric layer 54 and the metal filled vias 56–58 is planarized by a suitable means such as mechanical or chemical mechanical polishing (CMP).

In addition to the Guest-Host Liquid Crystal display described above, cholesteric LC reflective display and Holographic Polymer Dispersed LC (H-PDLC) reflective display may be fabricated. In cholesteric LC mode, each LC reflects the corresponding wavelength of incoming light (R, G, B) according to the rotating pitch of LC and fall color is achieved by additional color mixing. Black is presented by placing an absorbing layer at the bottom.

In H-PDLC mode, each H-PDLC layer consists of electrically controllable hologram, where a polymer and liquid crystal mixture has a layered structure showing wavelength dependent reflection characteristics, which is formed by using interference exposure of two laser beams known as the exposure method of volume holograms, and shows electrically controllable reflectivity change, In this H-PDLC scheme, there is a small reflection at each interface between the polymer and LC layer when the incident light beam sees a refractive index difference between these two layers; and no reflection when no index difference is observed by the light beam, where the observed refractive index of the LC is controlled by the applied electric field. Then, each H-PDLC reflects the corresponding wavelength of incoming light. Black is presented by placing an absorbing layer at the bottom.

In electrophoretic display 10 shown in FIGS. 1 and 1A–1D the planarized dielectric 32 with metal filled vias 38–40 is metallized by sputtering or evaporation or any other suitable means by an adhesion metal and a plating seed layer metal. Subsequently, a 5 to 15 micrometer thick Novolak positive working resist is applied by spinning, spraying, doctor blading or any other conventional means. After the usual prebake cycle, a pattern such as shown in FIG. 1 is exposed through a photo resist mask and developed. The pattern shown in FIG. 1 is electroplated using a conventional acid copper solution until the metal slightly "mushrooms" overhangs over the photo resist (not shown). Glass spacer 33 with the photo resist and the copper vias 38–40 imbedded in it is planarized by mechanical or Chemical Mechanical Polishing (CMP) process. The resist and the seed and adhesion layers are removed after the step of planarization.

Epoxy based photo sensitive dielectric such as commercially available SU8 or poly methyl methacrylate (PMMA) resist is applied and a pattern exposed leaving the edges (sidewalls) of copper vias 38–40 and wall electrode 34 overcoated with a very thin layer of dielectric to provide electrical insulation. In electrophoretic display 10, the metal vias 38–40 has to be covered by a thin dielectric to prevent discharge of the electrophoretic particles as they come in contact with electrode 22–24 during the collection process. If it is desired to have a very white reflective surface prior to application of SU8, the copper walls of wall electrode 34 and electrodes 22–24 may be immersion or exchange plating with Sn or Ag.

The thin layer of SU8 or PMMA remaining on top of copper electrode 22 is removed by a suitable means from the top of the patterns until the copper of electrode 22 is exposed. The exposed copper of electrode 22 is then terminated or covered by a thin layer of electroless Co(P), CoW(P), or CoSn(P) and is topped by a thin layer of immersion gold formed by the step of immersion plating for subsequent easy solderability. In addition, glass spacer 33 may be overcoated by a very thin layer 62 of a highly reflective metal such as Sn or Ag to provide maximum reflectivity of the ambient light 64. Reflective metal layer 62 may be overcoated by a very thin layer 65 of a transparent inorganic or organic dielectric. In one of the alternative schemes, the highly reflective metal layer 62 can be deposited just before the application of the SU8 dielectric or of the PMMA. Maximum use of incident light 64 is essential to realize bright, high contrast reflective displays 10.

Second layer 26 and the third layer 27 are substantially similar to each other. Glass spacers 30 and 31 consist of a very thin glass in which a plurality of via holes have been etched. Alternatively, glass spacers 30 and 31 are prepared from a very thin highly transparent plastic such as polyethylene, polypropylene, poly methyl methacrylate (PMMA) or other suitable sheets of plastic (polymer). The vias in plastic can be made by punching, etching or the vias can be formed by any other suitable means of via formation. Etching can be made by casting the film over a "bed of Nails" on a casting surface and the dry film can be then pulled off the mandrel. To reduce the paralax, and the reflective losses and to widen the viewing angle, these intermediate layers of glass or polymer are preferably as thin as possible.

The vias created in the glass or in the plastic are filled in by one of many possible means such as copper electroplating, conductive metal filled paste or by solder fill such as described in U.S. patent application Ser. No. 09/383325 filed Aug. 26, 1999 (YOR919990165US1) by Gruber et al. which is directed to an injection molded solder (IMS) method for filling high aspect ratio via holes with solder in electronic substrates which application is incorporated herein by reference.

As in the case of the bottom TFT carrying plate, after via fill the surface of glass spacer 32 is planarized by mechanical or CMP process. Glass spacer 33 is metallized with an adhesion metal such as Ta, Ti, W, or Cr and a conducting seed plating metal such as Cu, Ni, Au etc. Glass spacer 33 is overcoated with Novolack resist and after an appropriate prebake, a pattern representing electrodes 38–40 is exposed and developed. Copper is now electroplated until it slightly overplated or mushrooms over the resist. The slightly overplated structure is mechanically or CMP processed to planarize. The Novolak resist is removed and the exposed seed and adhesion layers are removed thus leaving the areas which are not covered by the electrodes completely transparent. Plated electrode 22 is than overcoated with photosensitive epoxy resist such as SU8 or PMMA and all organic resist is exposed and developed except for very thin layer on the walls of copper electrode 22 to prevent an electrical discharge of the electrophoretic particles. Copper electrode 22 is topped off with an electroless Co(P), or CoW(P), or CoSn(P) layer and is then immersion plated with a layer of Au for subsequent easy soldering.

Figure 3:
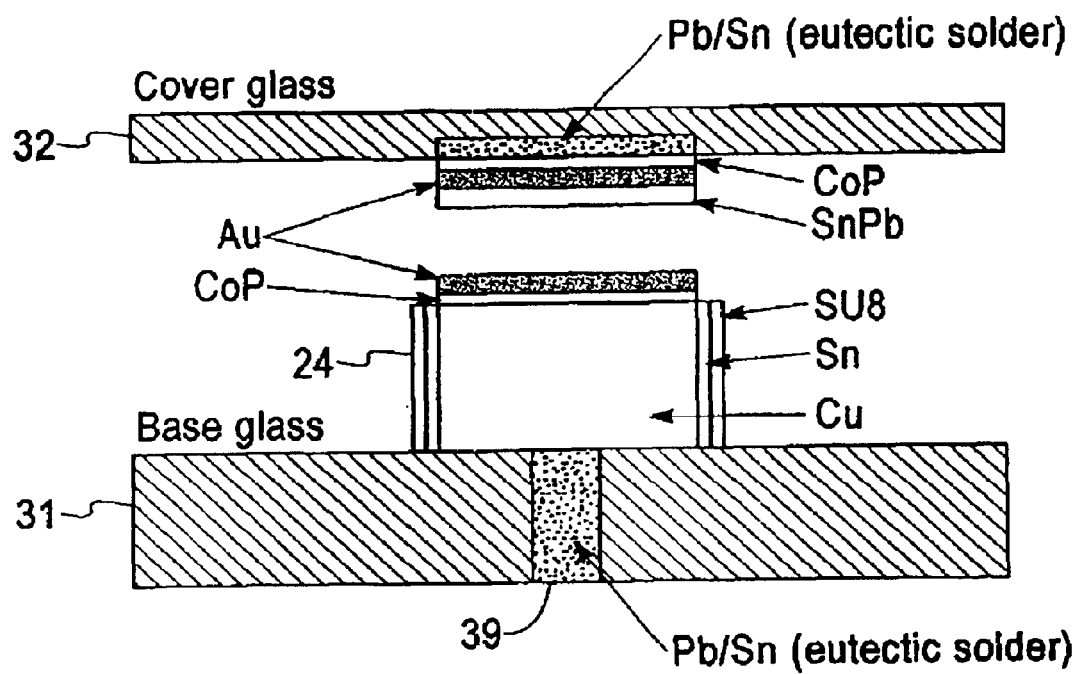
FIG. 3 is a schematic cross section view of a third embodiment of the invention.
Figure 4A:
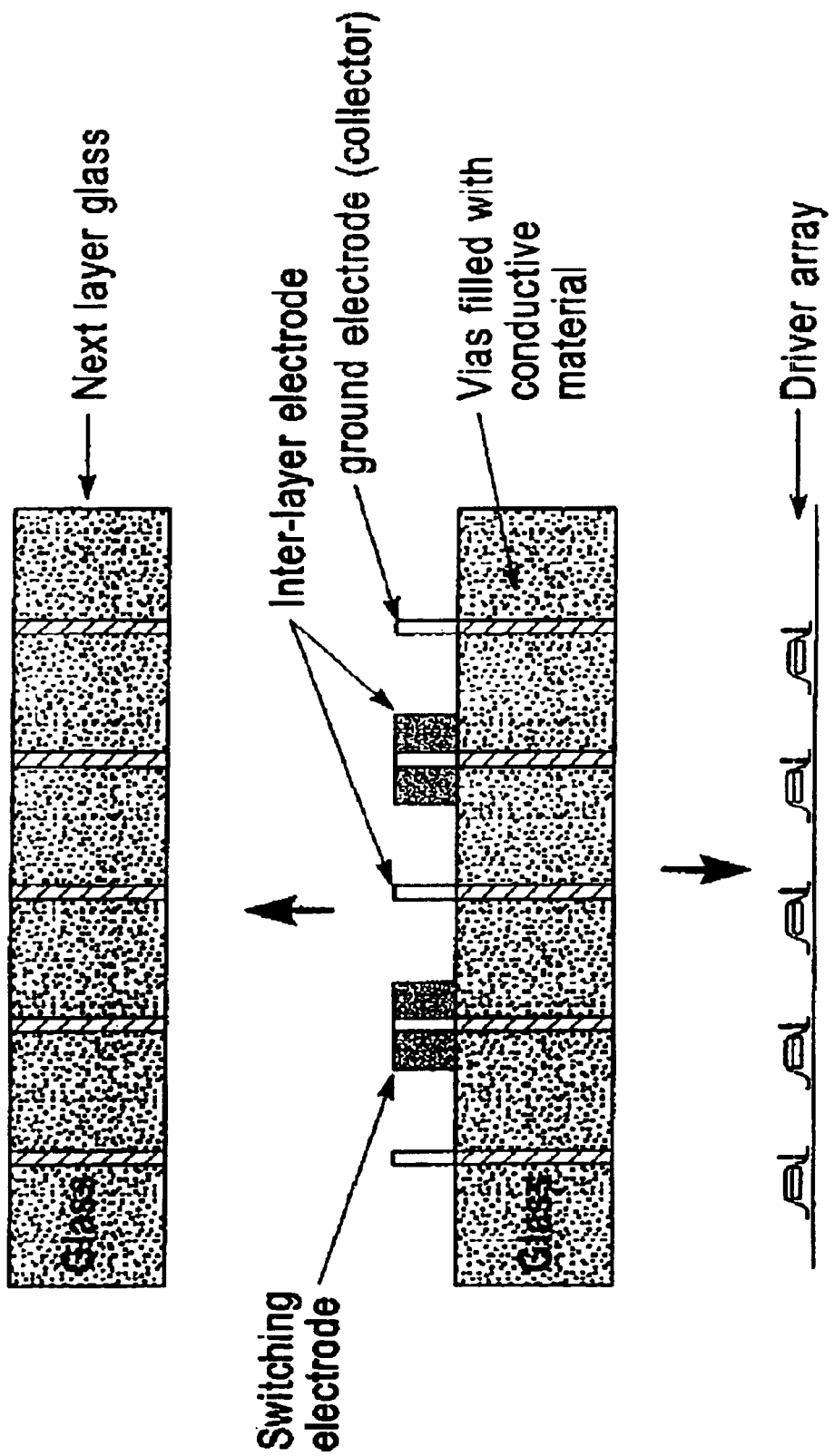
FIG. 4A is a schematic cross section view of a vertical connection.
Figure 4B:
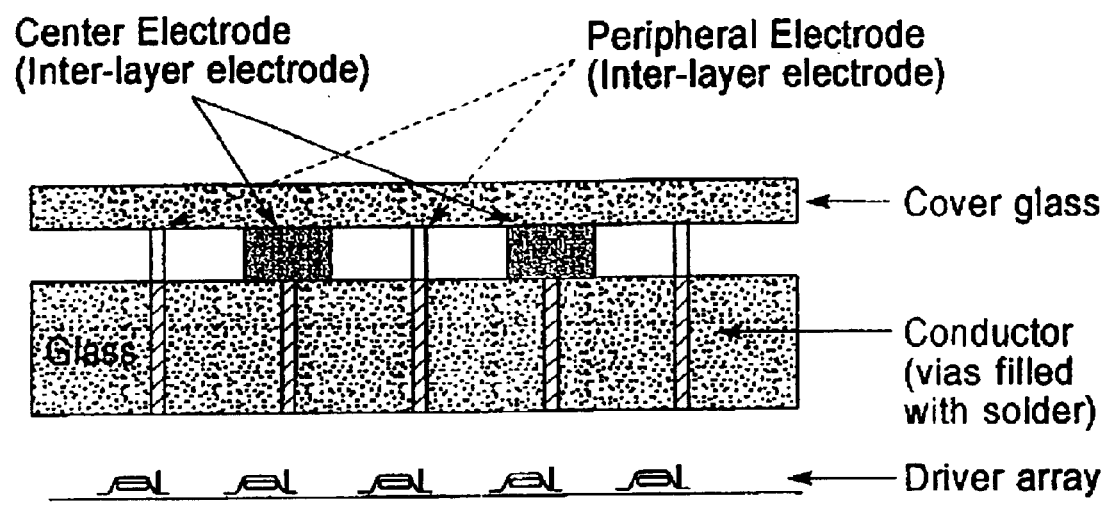
FIG. 4B is a schematic cross section view of the electrodes associated with a one layer electrophoretic display.

Fourth layer 28 can be prepared the same way as the second layer 26 and the third layer 27 except the fabrication process is terminated at the planarization step after the via fill. Alternatively, this layer can be prepared by only partially etching into the glass or polymer plate and then back filling the blind vias with solder. FIG. 3 shows the details of a completed fourth layer 28 from glass spacer 31 and cover glass 32 ready to be joined.

When all electrodes 22–24 have been separately prepared, they are mechanically or optically aligned, clamped and heated in a vacuum or a reducing gas atmosphere to a temperature several degrees above the melting temperature of solder to produce a bond between the solder and the gold interfaces or surfaces.

The final assembly consists of the glass substrate with TFT's two glass substrates with electrophoretic cell electrodes and one cover glass as shown in FIG. 1A.

Since there should be an electrical contact between cells in the vertical direction, the glass spacer 30 and glass spacer 31 in FIGS. 1A and 1B have holes in them. The holes are placed as shown in FIGS. 1A and 1B.

The holes in the glass are filled with a metal as shown in a series of sketches in FIG. 5A–5D. The metallurgy on TFT substrates and on the glass spacers 30 and 31 are fabricated in an identical fashion. Top cover glass 32 is metalized to permit assembly and rigid hermetic sealing.

The individual cell compartments are interconnected by a number of apertures or openings 45 near the corner to permit easy filling of the display with the electrophoretic or LC solution. The holes are placed at the corners as shown in FIG. 1 since the corners provide very little current or potential to the cell. This, therefore, does not affect the operation of the display.

The metallurgy used is copper followed by electroless Co(P) or CoW(P) and immersion Au strike and low temperature (70° C. to 300° C.) SnPb, SnBi, SnIn or SnGe. Alternatively, the copper can be replaced by Ni. The overcoat for metal is SU8 resist (epoxy based negative UV resist) or PPMA. For solder joining, the assembly process is simple and partly self aligning.

Glass spacers 30 and 31 with holes are shown in FIGS. 1 and 1B. Glass spacers 30 and 31 may be Hoya photosensitive type glass supplied by Hoya Manufacturing Company located in Japan. Glass spacers 30 and 31 may be ordered with holes in them according to a supplied pattern.

In one variant of via fill, the glass is pressed against a conformable substrate such as metal filled epoxy, elastic polymer with a thin foil of Au or stainless steel on it. This substrate is used at the cathode. During electroplating, the metal plates on the cathode filling the vias and is allowed to overplate over the glass surface. The overplated metal is removed by mechanical polishing or chemical mechanical polishing (CMP). The planarized substrate attached to the metal carrier is processed further as shown in FIG. 5A-5E.

The planarized metal filled glass is sputtered with 200 Å with Ti, Ta or Cr adhesion layer and by 800 Å of Cu or 1000 Å of Ni seed plating layer. The planarized metal glass substrate still etched attached to the cathode is spun on with 8 to 15 micrometers of Novolak resist such as AZ4620. After mask alignment with the metal filled vias, AZ4620 is exposed and developed opening the metal seed layer. Ten to fifteen microns of Cu or Ni are then electroplated through the mask. The resulting copper filled AZ resist (Ni filled AZ resist) is polished or planarized by CMP. 2000–5000 microns of SnPb eutectic composition or SnBi, Snin or SnGe is electroplated. Then, the AZ resist is removed by blanket exposure with UV and development. The seed layer of Cu is removed by chemical or sputter etching followed by chemical removal of Ti or Ta using 1% of HF in water.

A layer of SU8 or PMMA is applied by spinning or spraying and is cured. The resist is then planarized sufficiently to expose the electroplated solder SnPb, SnAg, SnBi, Snin or SnGe. A mask is exposed and developed which leaves very thin dielectric on the sides of the metal walls.

After removal of glass spacer 30 from the substrate (cathode carrier) the parts are dipped into an electroless Sn or In solution to overcoat the metal by thin solder 2000 to 3000 Å.

When all individual parts are completed they are aligned, clamped, and heated in a vacuum or a reducing gas atmosphere. When the melting temperature of the solder is reached, the interdiffusion of solder and metal (Au) takes place and a solder joint takes place. The assembly is then cooled to room temperature. The individual spaces (layers) are then filled by various color (RGB) electrophoretic fluids or by LC material to form layers 26–28 and the part is sealed.

Figure 5A:
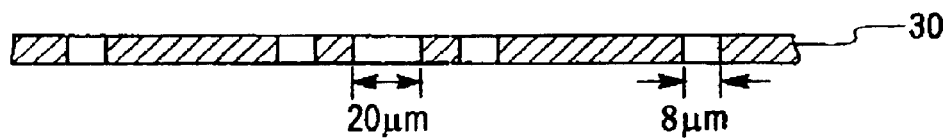
FIGS. 5A–5F show schematic cross section views illustrating the process steps in forming a display.
Figure 5B:
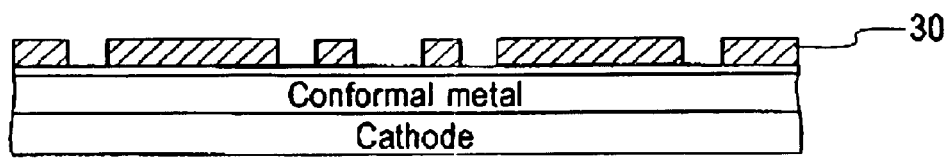
Figure 5C:
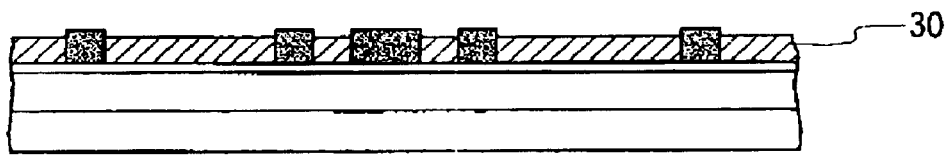
Figure 5D:
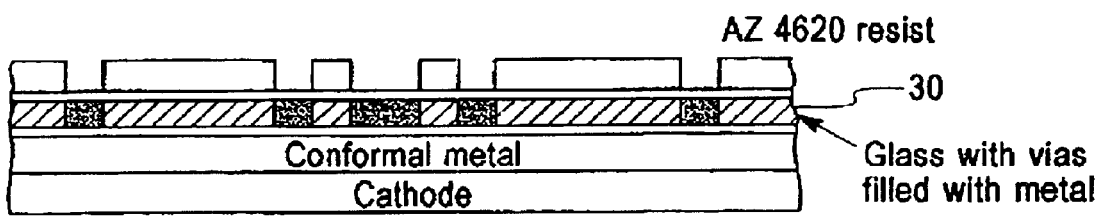
Figure 5E:
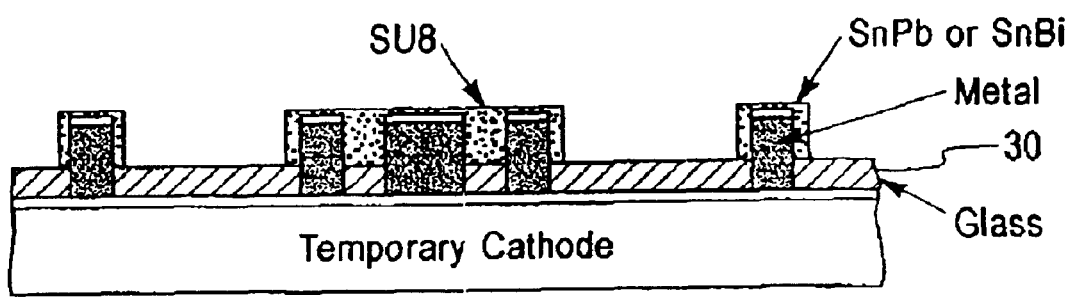
Figure 5F:
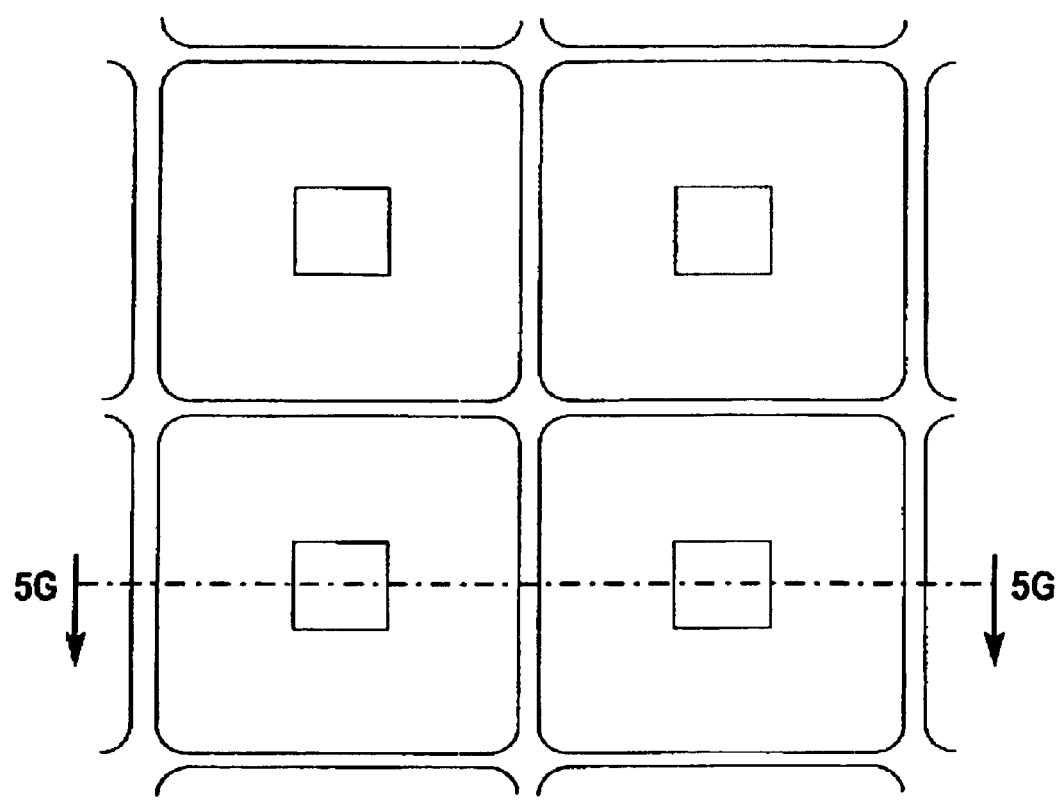
Figure 5G:

The top cover plate shown in FIG. 5F is a top view. FIG. 5G is a cross section view along the line 5G—5G of FIG. 5F.

The glass is prepared in the following way. The glass is coated with Novolak type resist for example AZ4620 and is exposed with pattern with a slight overhang. The glass is then etched about 5000 Å to 10,000 Å deep with HF. After rinsing, it is sputtered with 500 Å of Ta, Ti or Cr and a lift off is performed thereby filling the grooves. Alternatively, electroless Ni is plated into the grooves. The plated Ni is then overcoated with a thin layer of Sn, SnPb, SnAg, SnIn or SnGe.

The vias in glass spacers 30 and 31 can alternatively be filled by using a conducting paste which was pushed or squeezed into the vias and cured after filling. Due to shrinkage of the paste, a second fill with fresh paste may be necessary. The glass with the conducting filled paste is then planarized as it was for Cu plating but the planarization now must be done on both sides. The electrodes are now formed on the glass with metal paste filled vias in the same way as it was done in case of Cu filled vias.

After the solder fill, the electrode formation process is the same as described in the case of copper via fill process.

Further examples of the fabrication process are given.

In one approach, vias are made in glass, transparent plastic such as polypropylene, Poly Methyl Methacrylate (PMMA) or silicon based plastic. The vias are filled by conducting metal which can be copper, nickel, permalloy or solder such as PbSn, Sn Bi, SnAg or Snln, SnGa, etc.

The filling can be accomplished by (1) electroplating, or (2) electroless plating with Cu, NiP, NiB, or any other electroless metal or a metal alloy.

When filling vias deep or long vias such as in glass spacers 30 and 31, the walls of the vias, to improve solder wetting and adhesion, may be first metallized by suitable metallization such as evaporation, sputtering, or electroless plating with Cr/Cu, Ta/Cu, Ta/Cu/CoP/Au, Co(P)/Au, etc.

For further processing and stacking the layers, it is desired after the via fill to planarize the surface on each side of glass spacers 30 and 31 after filling the vias therein. Such planarization can be accomplished by mechanical or by Chemical Mechanical Polishing (CMP).

When copper is used, the CMP process may be similar to the CMP process used in preparation of copper interconnects on semiconductor chips which is well known in the art by chip manufacturers.

Figure 6A:
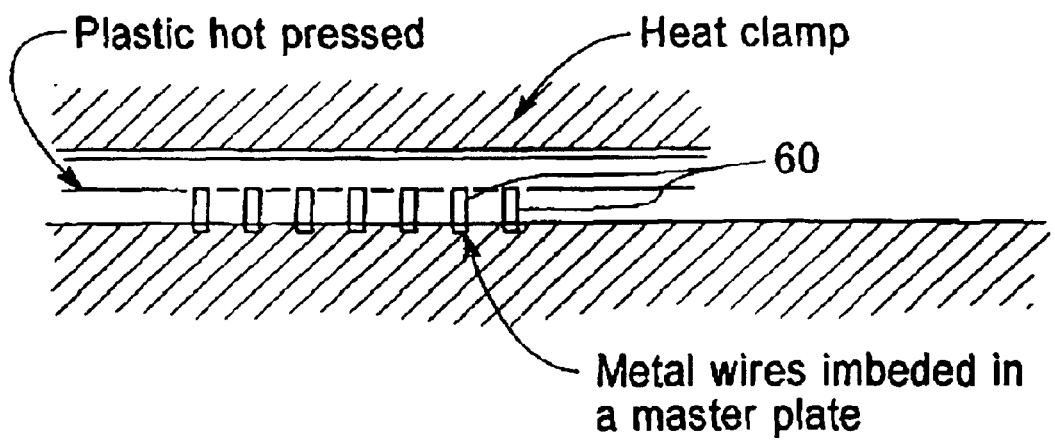
FIGS. 6A–6C show schematic cross section views illustrating three ways for forming vias.
Figure 6B:
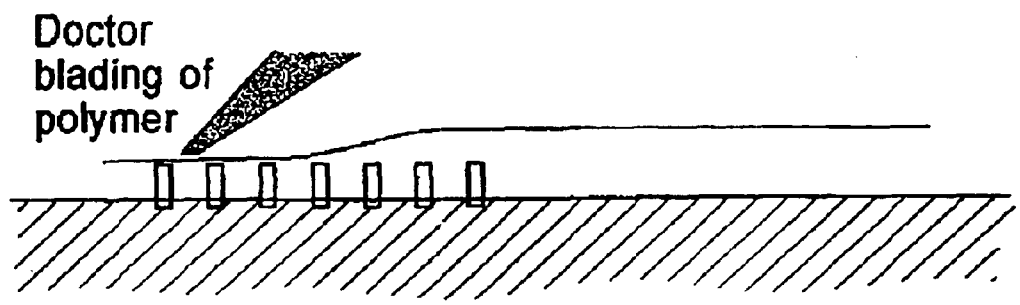
Figure 6C:
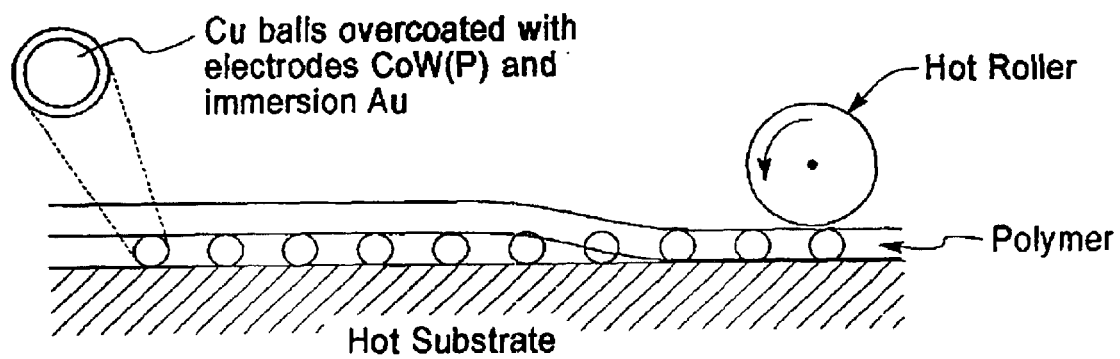

When instead of forming vias by plating or solder fill, metal studs or wires 60 may be used as shown in FIGS. 6A–6C. In FIG. 6A metal vias 60 are positioned in a polymer by hot pressing and molding. In FIG. 6B, metal vias 60 are positioned in a polymer by casting or doctor blading of polymer. In FIG. 6C, Cu balls overcoated with electroless CoW(P) and immersion Au are positioned in a polymer by hot molding. It may also be necessary to planarize the surface. In such case CMP or mechanical planarization methods can be used.

When the structure is used to prepare an electrophoretic display the separators between the individual layers serve at the same time as electrodes.

The easiest way to form such electrodes is by electroplating. The electroplating can be accomplished by the plating through mask technology described in L. T. Romankiw, Electrochemica. Acta., vol. 42, No.20–22, (1997) 2985.

In this process, the surface is first metallized with adhesion and conducting plating seed layers by sputtering, evaporation or plating of layers such as Cr, Ti, Tc, Ta, W, Ni, NiFe etc followed by a conducting layer such as Cu, Au, Zu, Ni etc. A photoresist layer is applied such as AZ resist, Shippley, PMMA, etc. A mask with a suitable pattern such as shown in FIG. 1A is exposed and developed. After development, any remaining resist residue from developed areas is removed by ashing by plasma treatment in a suitable gas such as forming gas H2/N2 mixture, O2/N2 mixture etc.

The exposed pattern is then filled by electroplating with copper or another suitable conducting metal until the metal mushrooms out of the resist grooves as shown in FIG. 5C. The planarizaiton is accomplished in an identical way as described above under CMP.

After planarization, the resist is removed by blanket exposure to TV and development or by a suitable organic solvent which does not attack the electroplated copper (Ni, etc.) The electrode pattern process formation is completed by sputter etching, chemical, electrochemical and chemical method. Upon completion of this process, the substrate becomes completely transparent. For subsequent easy joining to the layers, it may be desired to immersion coat the copper with Sn, or Ag. Both Sn and Ag are white reflective metals and thus additionally help create white background in the display and hence better reflection and better contrast.

The above process can be used to prepare each individual layer except for the first TFT carrying (bottom layer) and the fourth (top cover) laye 32.

While the TFT carrying substrate can be completely separate and can be joined to the layers above by soldering in the same way as all the layers are joined together, the TFT substrate can also be used as a first electrode forming substrate.

If the latter is the case, the TFT carrying substrate is covered by a suitable insulator, such as $SiO_2$, $Al_2O_3$, etc, vias are open in the insulator to make appropriate electrical contacts and the substrate is then processed as described earlier under electrode formation (or the transparent glass spacer).

A thin adhesion (diffusion barrier layer) is applied followed by thin plating seed layer using suitable means such as Cu, Ni, etc by evaporation or electroless plating. A thick resist layer is applied, UV exposed, developed and organic resist residue is ashed. Copper is electroplated, planarized. Then, the resist, plating seed and adhesion layers are removed, and immersion Sn or Ag is deposited on Cu.

In one version the top or cover glass 32 can be prepared by forming vias similarly as in all other cases and filling the vias with copper, Ni or solder. Because no electrodes are necessary on the top layer after planarizing the vias the top side of the cover glass 32 may be covered by a thin layer of transparent inorganic or organic layer. This layer can be $SiO_2$, $Al_2O_3$ or PMMA, Polypropylene, polyethylene etc. This coating can be done either prior to joining or after the structure has been joined together.

In an alternate approach the bottom side of the cover glass 32 may be patterned with a pattern as shown in FIGS. 1D, 3 and 5F. The bottom side of the substrate is then sputtered in a sheet form with adhesion layer such as Cr, Ti, Ta, W, etc followed by thin Cu, Au or Ag layer. The excess metal is then removed by polishing, leaving metal only in recesses. The blind vias are then filled with SnPb or any by other solder using injection moled solder (IMS) such as described in U.S. Pat. 09/363,325 by Gruber et al. or any other suitable material such as solder paste.

Figure 7A:
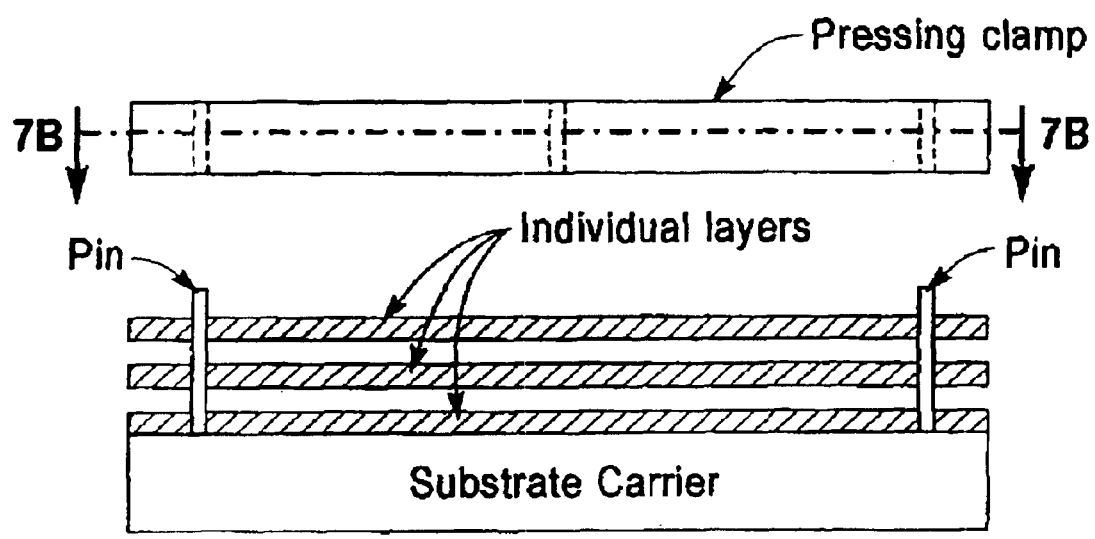
FIG. 7A shows a schematic cross section view of a step in forming a display.
Figure 7B:
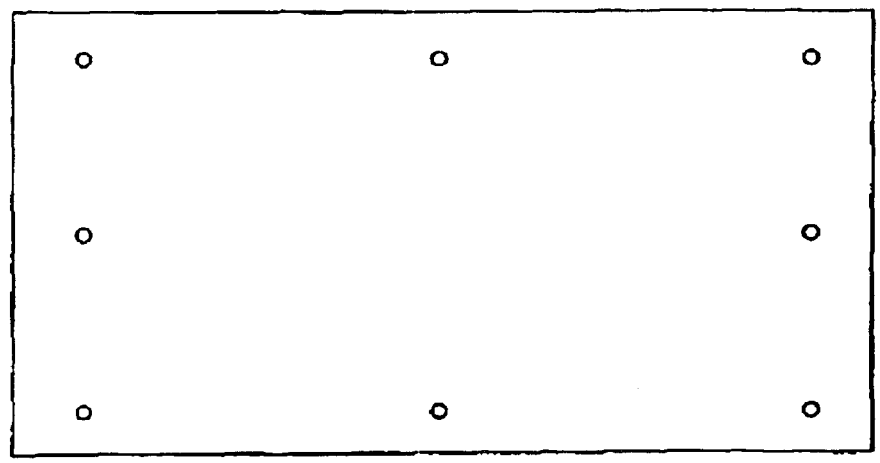
FIG. 7B shows a top view of FIG. 7A.

After solder filling, the excess solder is removed by mechanical polishing CMP means. The final structure is assembled by aligning all the layers using optical means or a suitable mechanical means. The mechanical means may consist of slipping the layer with suitably located pins on a substrate as shown in FIG. 7 and clamping the structure together. The clamped structure is then joined by heating and soldering all the layers together at a suitable melting temperature of solder chosen for this step. The soldering is done preferably in reducing atmosphere or in vacuum. No flux is used so as not to leave a surface residue which may interfere with operation of the display.

If copper was not pre-coated with Sn, Ag or Au, it is desired to expose such copper surface to a fluorocarbon containing plasma. This replaces oxygen from copper and makes it easier to join to solder.

It should be noted that it is possible to use only a very low temperature solder such as SnPb, Snin, SnGa. The use of low temperature solder is will promote quick and easy joining. By providing a suitable material such as Au, Ag, or Cu as contact layer and holding the structure together tat the soldering time and for a time longer than necessary to just melt the metal, to wet and to solder. By heating for a longer time, it is possible to form a joint which will withstand, in the future, higher temperatures due to diffusion of enough Au, or Ag or Cu into the Sn, SnPb, SuIn or SnGa solder so that a higher melting solder is formed (ie. SnPbAu, SnPbCu, SnInCu, SnGaAu or SnGaCu or SnPb with Sn content higher than that of a eutectic composition).

Figure 8B:
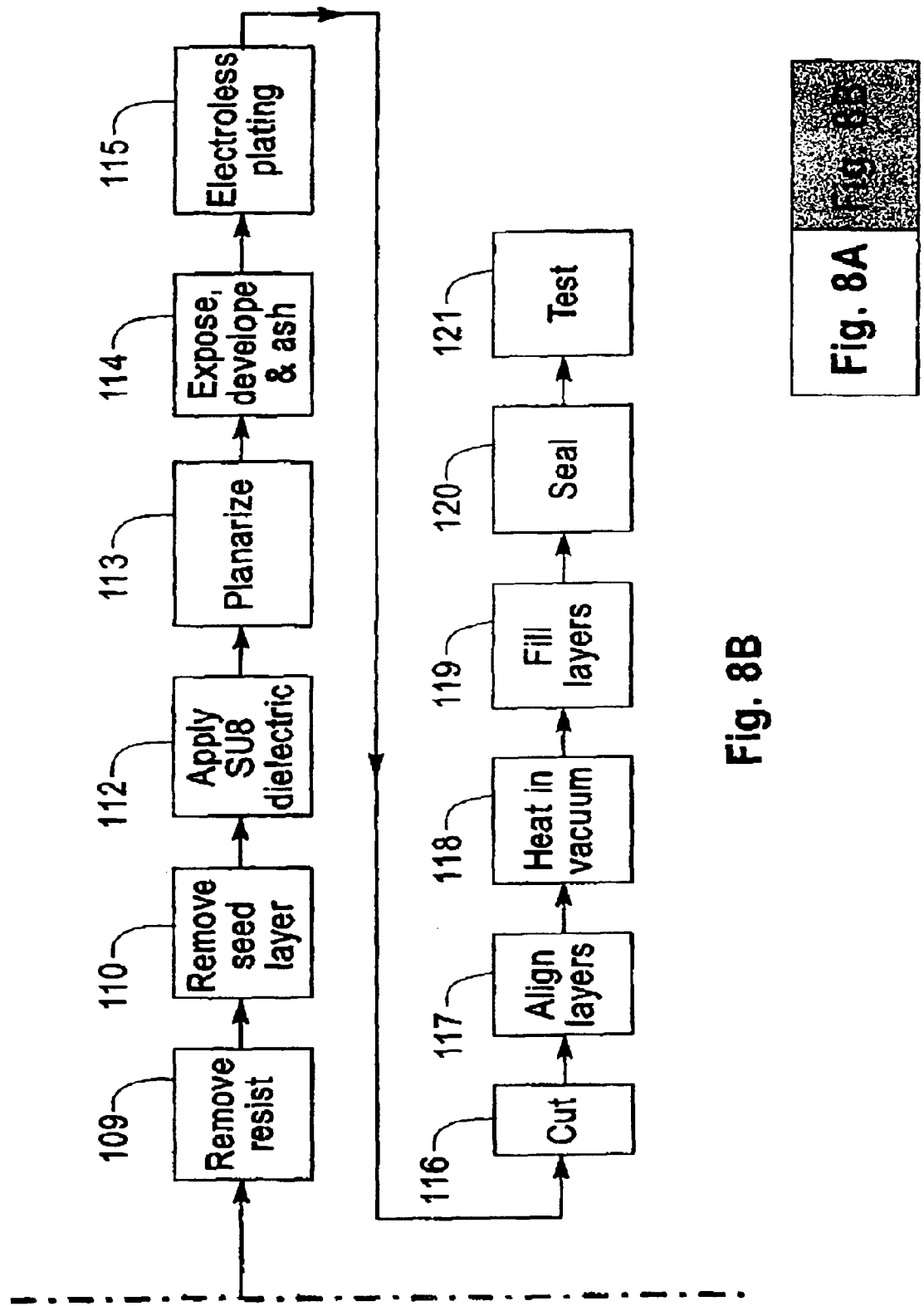
FIG. 8 shows a schematic and block diagram showing the steps for forming individual layers of a display and assembly of the layers into a display.

While the process has been demonstrated in the batch mode, a much cheaper process would be to provide the same process on a reel to reel automated line. Such line is shown in FIG. 8. A thin polymer 100 is fed off reel 101 having alignment sprockets 102. Into the hole or via fabrication station, station 103, there are four ways to generate the vias such as by punching, chemical etching followed by solder fill, conductive paste fill or Cu electroplating as described earlier. Alternatively, the metal wires or metal balls may be pressed into a soft polymer without having to create holes for the wires thus imbedding the metal vias into a heated plastic or polymer 100. Alternatively, one can cast the polymer over the metal particles or wires to form the vias upon hardening of the polymer.

The thin polymer with vias or tape is then fed into a planarization station 104 in which both sides are planarized by mechanical or CMP method to expose the metal and make it planar with the metal. The tape from station 104 is fed to station 105 in which one side of the tape is metalized with 100 to 200 angstroms of adhesion metal such as Ti, Ta, or Cr followed by 800 to 1000 angstroms of Cu seed plating layer. The tape is then fed into photolithography station 106 in which photoresist (AZ4620 or similar) is applied by rolling on or spraying, doctor blading or any other suitable means. The resist thickness may be in the range from 8 to 15 microns. The resist is then dried. The patterns are exposed, developed and the resist residue is removed by ashing. The tape is then fed into a copper electroplating station 107 where 10 to 15 microns of Cu is electroplated through the mask. The plated tape is now planarized in a station 108 using CMP so the Cu and resist are coplanar. The tape from station 108 is fed to station 109 where the resist is removed by blanket UV exposure and development. The tape is then moved to station 110 where the seed layer and the adhesion layers are removed by chemical or sputter etching means. The tape with Cu electrodes created is fed into a station 112 where the photosensitive dielectric such as SU8 or PPMA is applied by rolling on or spraying. The photosensitive dielectric is cured and fed into station 113 where it is planarized until the copper is exposed. The tape is then fed into station 114 where a mask is aligned and the photosensitive dielectric is exposed and developed and ashed to remove the resist residue leaving the sidewalls of the metal electrodes coated with a thin dielectric. This is essential to prevent electrophoretic particles from discharging on bare metal. The tape is now fed into an electroless plating station 115 in which Pd activation takes place and is followed by CoW(P) plating, and by immersion Au plating. The tape is then cut into individual substrates in station number 116. The individual substrates are then aligned with TFT's substrates and are clamped together in station 117. The assembled clamped parts are moved to station 118 where they are heated in vacuum or a reducing atmosphere until a metal joint between solder and Au takes place. The substrates are moved to station 119 where cavities in individual layers are filled with electrophoretic fluids or LC fluids. The filled displays are moved to station 120 where they are sealed and sent for testing in station 121.

Figure 9:
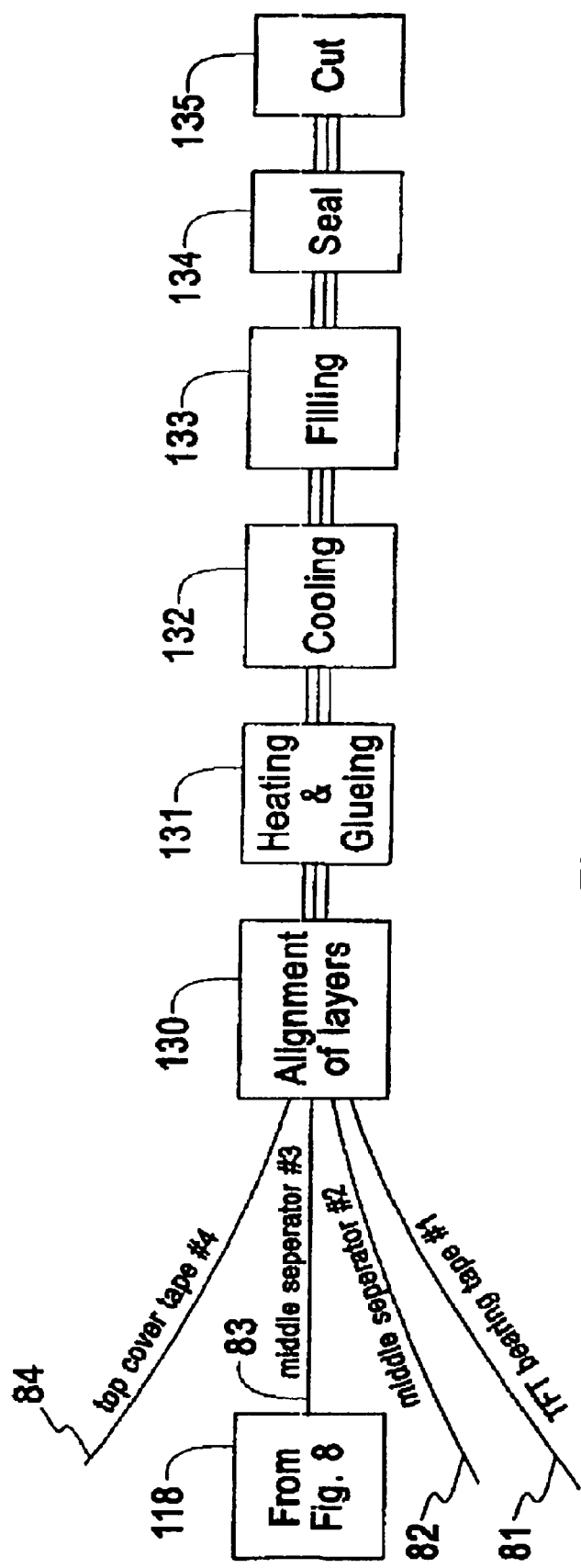
FIG. 9 shows a block diagram for an alternate method of assembling layers into a display.

In an alternate version as shown in FIG. 9, tapes 81–84 produced in several parallel stations the cover tape 84, the inner tape 83 and the inner tape 82 and the bottom tape 81 with the TFT's are brought together in station 130 where the patterns on the respective tapes are aligned with respect to each other. The four tapes 81–84 are clamped or pressed together and transferred into station 131 where vacuum and/or reducing atmosphere are applied and the tape is heated to about the melting temperature of the solder used. This results in interdiffusion of solder and Au creating a higher melting temperature solder and the solder and Au become a glue with respect to the substrates they were originally on. The tape is then passed into a cooling chamber 132 where it is slowly cooled to room temperature. From Chamber 132, it is passed into a cutting chamber where individual displays are cut. The individual displays are passed into chamber 133 where the spaces between the layers are filled with different electrophoretic fluids or LC materials. From chamber 133, the displays are passed into chamber 134 where they are sealed and then into chamber 135 where the displays are tested. If only polymer or thin glass substrates or tapes are used in creating the displays, the displays will be flexible and can be bent or curved without damage. More layers can be inserted for addition vertical cells to gain additional color tinges and improved sharpness by using black and/or white in addition to the three primary colors RGB.

Figure 10A:
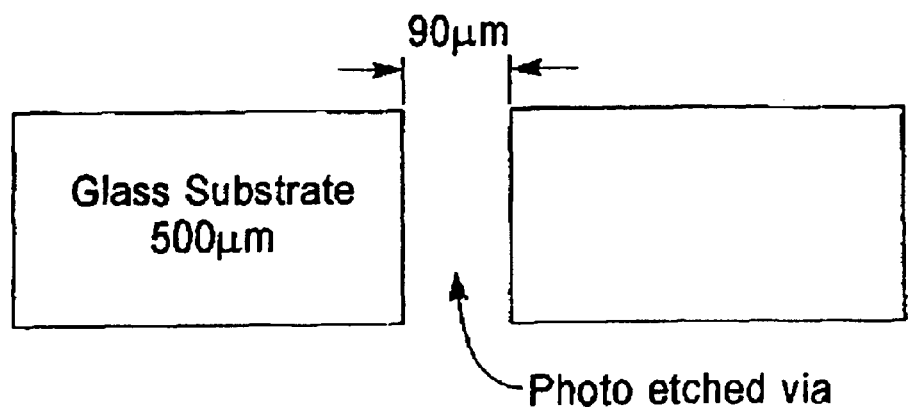
FIG. 10A shows a schematic cross section view illustrating the fabrication of the ITO electrode in a Guest-Host liquid crystal display.
Figure 10A:
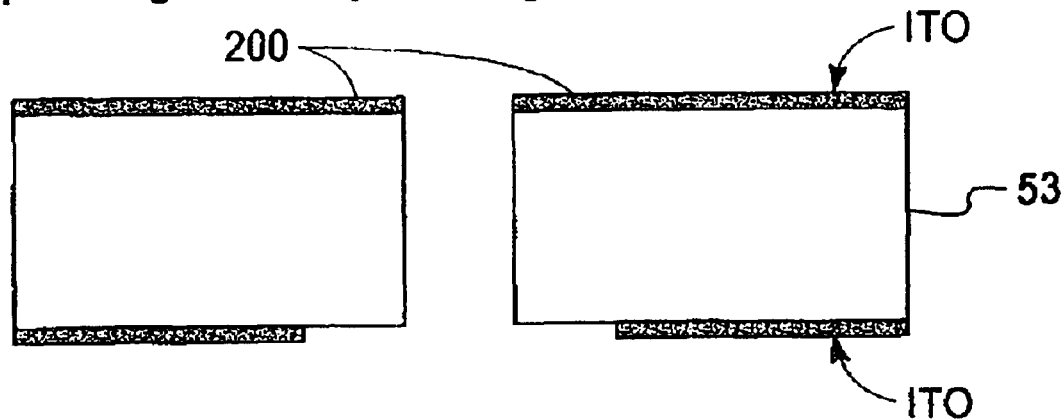
Figure 10B:
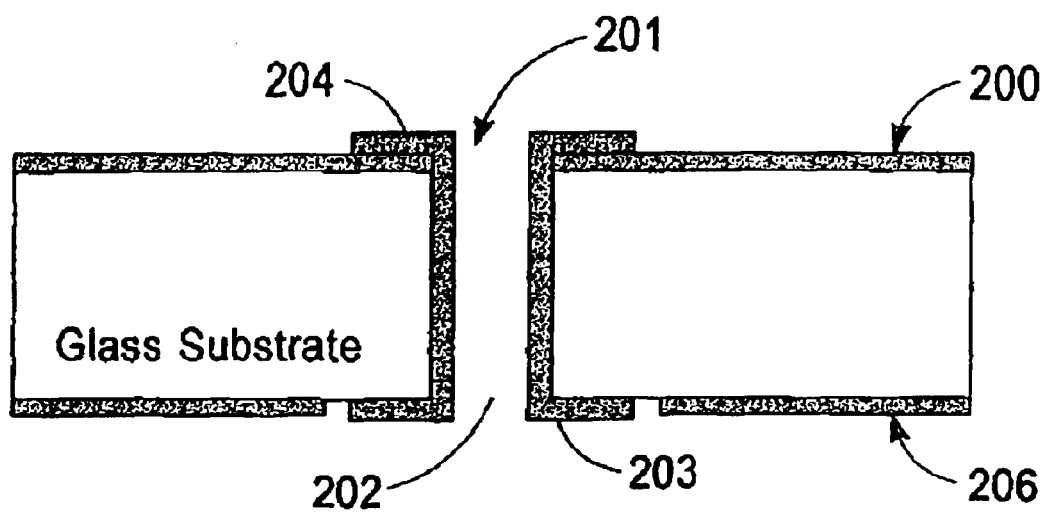
FIG. 10B shows a schematic cross section view illustrating the vertical electrode and ITO in a liquid crystal display.
Figure 10C:
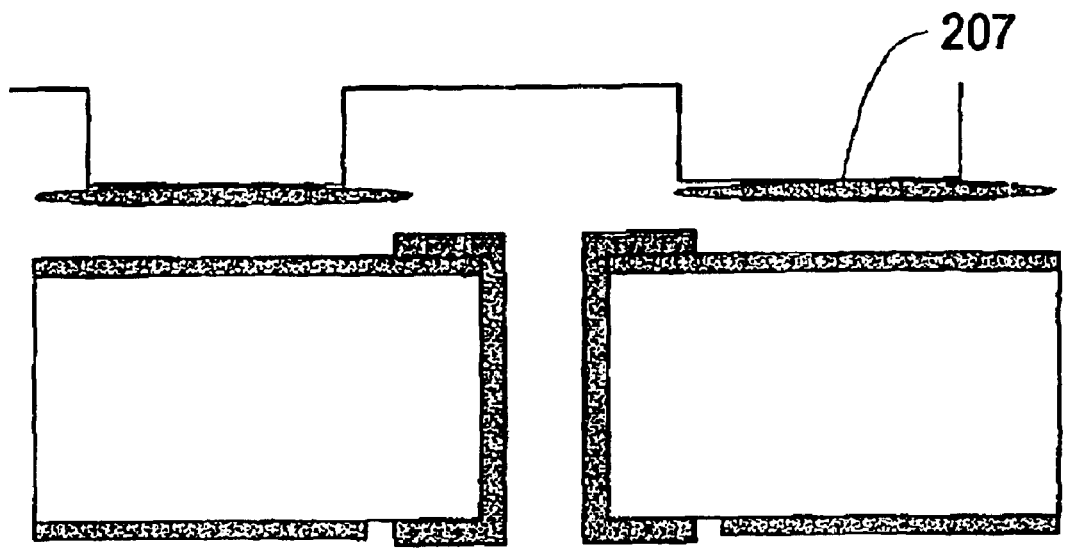
FIG. 10C shows a schematic cross section view illustrating the step of applying a polyimide coat over the ITO in a liquid crystal display.
Figure 10D:
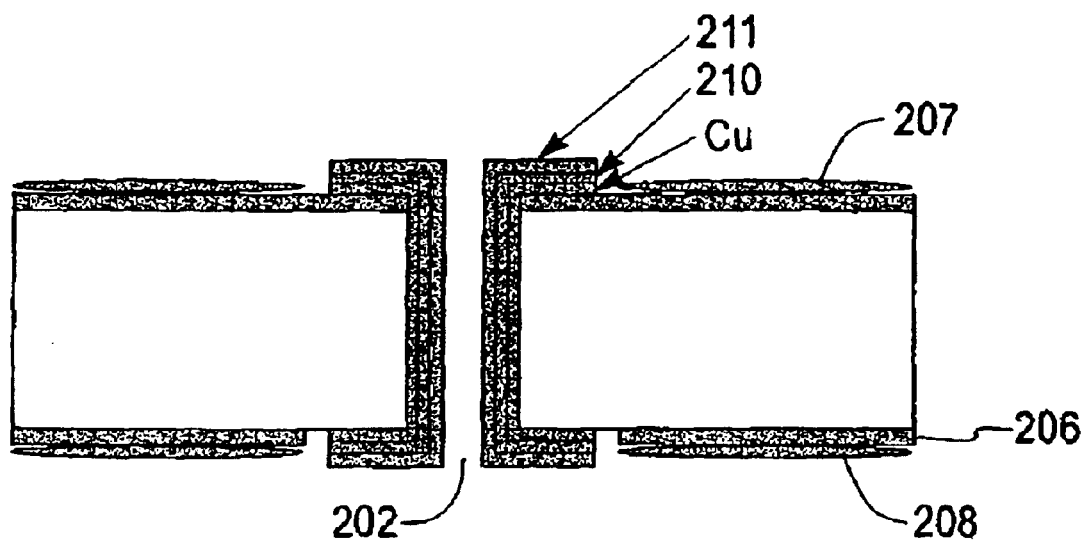
FIG. 10D shows a schematic cross section view illustrating the preparation for joining layers at the vias in a liquid crystal display.
Figure 10D:
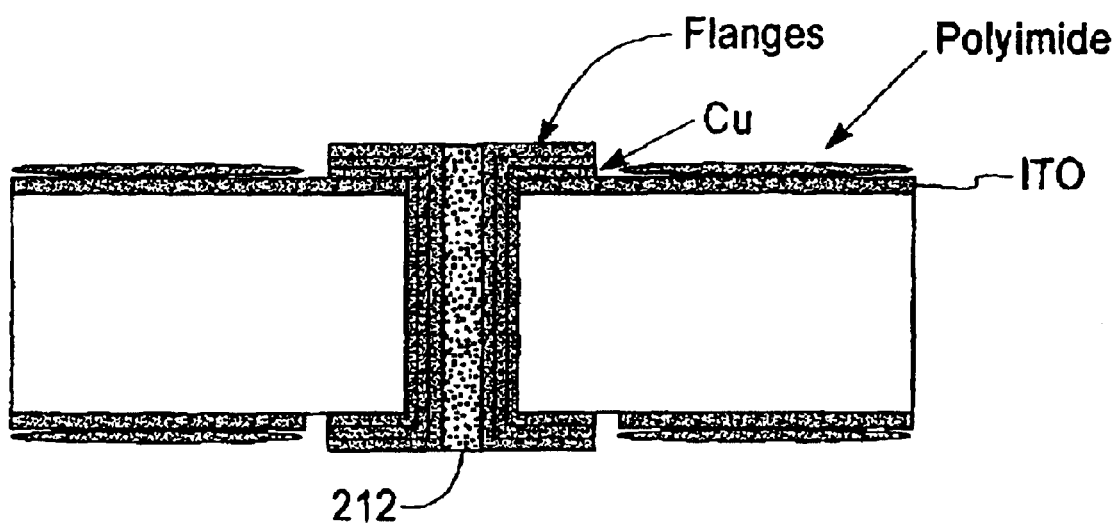

Referring back to FIG. 2, the preferred embodiment a guest host stacked LC display 50 is shown. Like in the electrophoretic display 10 shown in FIGS. 1, 1A–1C, use is made of several glass or polymer substrates 51, 53 and 55. The first step in the process consists of forming vias in the glass or polymer substrates 51 and 53. If the Hoya photosensitive glass is used, the substrates can be purchased from the Hoya Corporation in Japan. The pattern layout is produced as desired for a given display. After forming vias, both sides of the glass substrates 51 and 53 and one side of substrate 55 are sputtered with indium tin oxide (ITO) as shown in FIG. 2. Referring to FIGS. 10A and 10B, one side of substrate 53, has ITO 200 which extends all the way to the edge of the via 202 so as to make electrical connection with copper 201 plated inside the via 202. The copper is electrolessly plated inside the via and subsequently etched to form flanges 203 and 204 on each side of the glass substrate 53. Flange 204 makes electrical contact with ITO while flange 203 stopes short of ITO 206. The flanges are defined by, for example, chemical etching or other suitable means. ITO 206 may be etched away from via 202 to make an electrical break between the copper flange 203 and ITO 206. As shown in FIG. 10C, ITO 200 is printed with a polyimide 207 pattern which functions to orient the LC material when applied. As shown in FIG. 10D, polyimide 208 is printed on ITO 206 to orient the LC material when the LC material is applied. At this point, the copper vias and flanges 203 and 204 are activated with Pd and electrolessly plated with CoW(P) 210 and subsequently immersion coated with Au 211. The vias 202 are then filled with PbSn solder 212 by the IMS technique described above. If necessary, both sides are planarized and solder reflowed. The substrates are then stacked in the proper order, aligned and clamped between two plates and heated to above the melting point of the solder to create the solder joint between the individual substrates. The height of the flanges 203 and 204 defines the separation gap between the respective substrates and becomes the space which is eventually filled with the liquid crystal material containing dyes. Table I shows the smallest via dimensions that can be produced in various substrate thicknesses (aspect ratio) and also shows the aperture ratio in percentages for different sized vias in a 300 micron square pixel.

TABLE 1

| Substrate thickness (Microns) | Via Diameter (Microns) | Aperture ratio (%) (3 vias in 300 Microns □ 300 microns) |
|---|---|---|
| 500 | 90 | 79 |
| 200 | 36 | 97 |
| 100 | 18 | 99 |

Figure 10E:
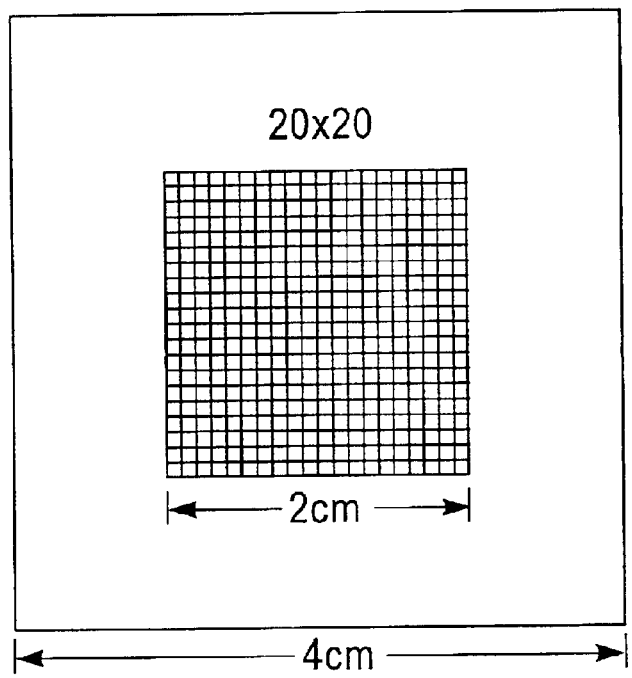
FIG. 10E shows a schematic top view illustrating the ITO in the first level in a liquid crystal display.
Figure 10F:
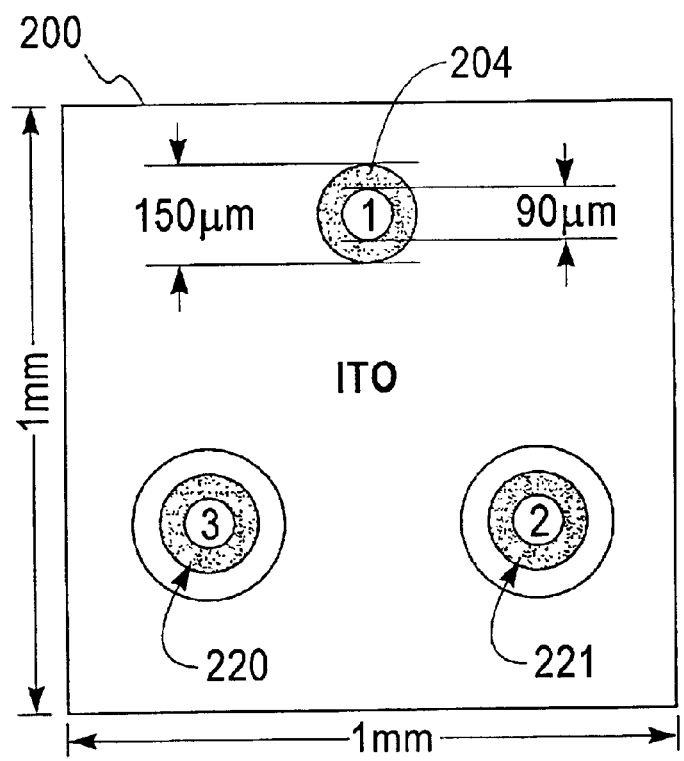
FIG. 10F shows a schematic cross section view of the three levels in a liquid crystal display.
Figure 10G:
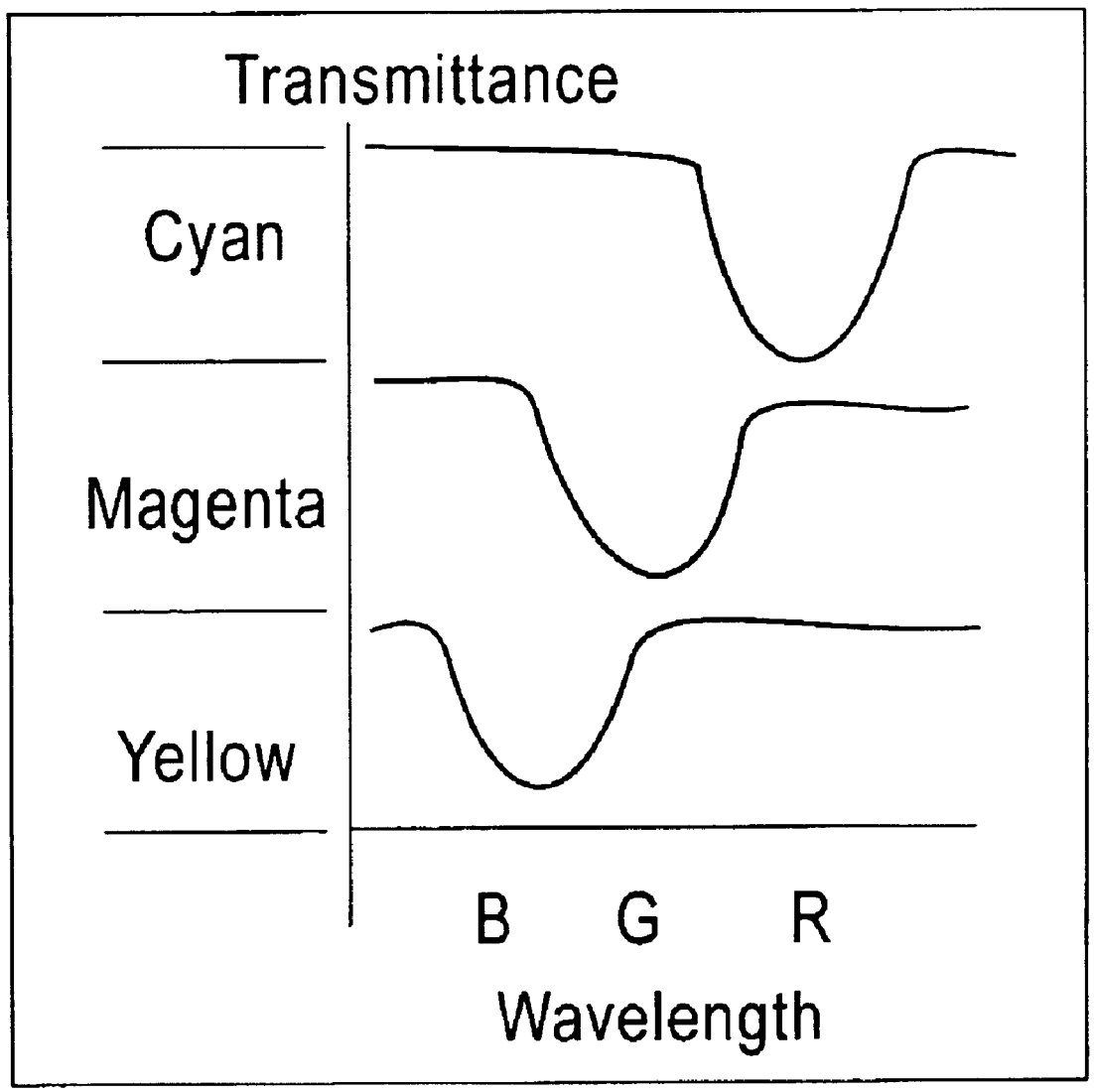
FIG. 10G shows the desired spectral response from the three cell stacked pixel in operation.

FIG. 10E shows a top view of ITO 200 with flange 204 making electrical connection to ITO 200. Flange 220 and 221 are isolated by a space from ITO 200 to permit electrical connection to higher level cells. FIG. 2 shows the completed three layer structure filled with cyan, magenta and yellow dyes. In operation with a potential on the three ITO's, the spectral response corresponding to the respective layer is shown in FIG. 10F.

In an alternate embodiment, the substrates may alternate in having vias filled with solder since the soldering will seal the opening. This approach does not require as careful precleaning of the solder before joining because the solder in one substrate connects to a Au plated flange in the second substrate. In a third alternate embodiment, none of the substrate vias are filled with solder but the bonding is done by Au to Au diffusion bonding at elevated temperature such as 300 C or higher.

Figure 11:
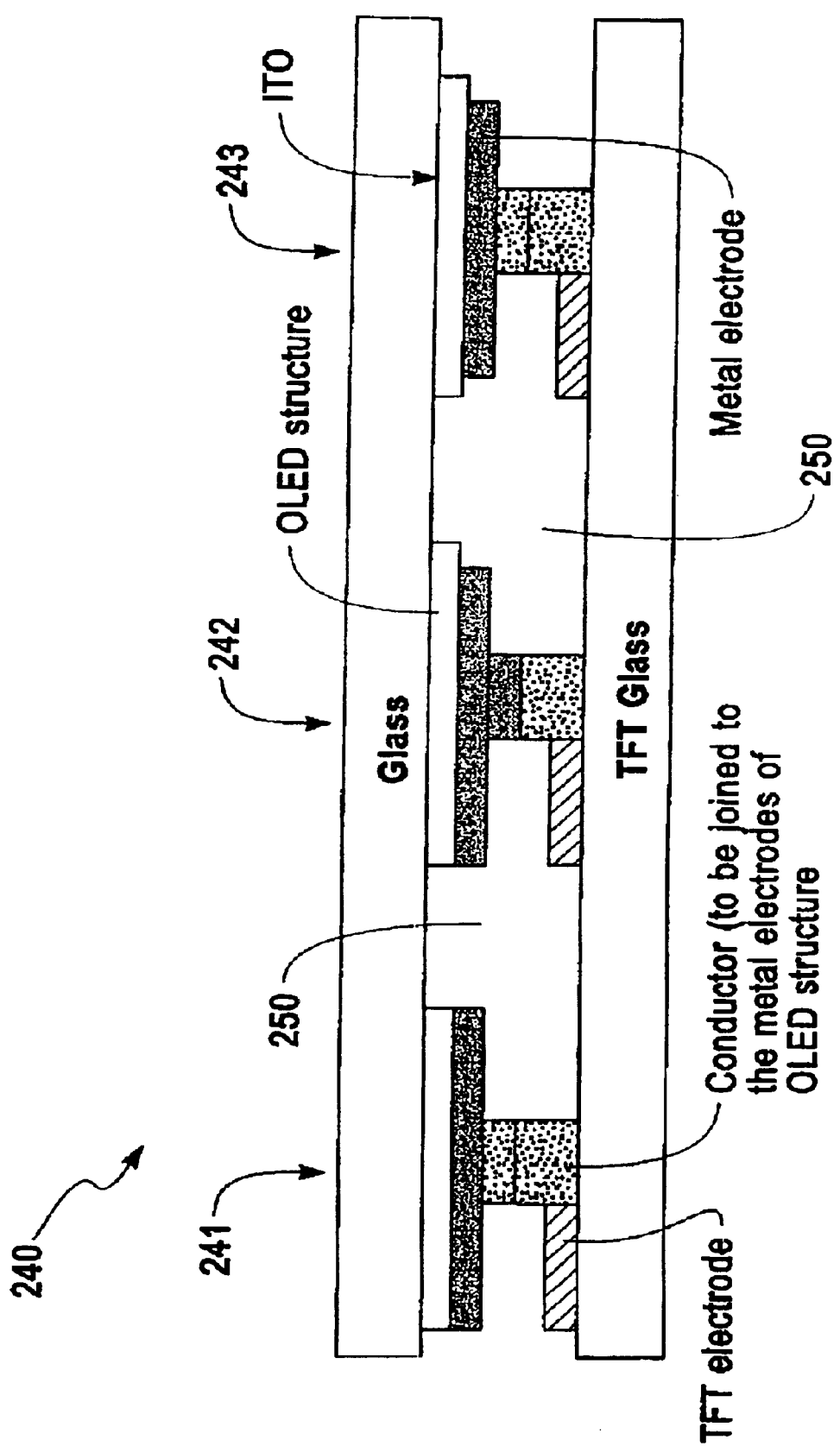
FIG. 11 is a schematic cross sectional view of a one layer Organic Light Emitting Diode (OLED) display.

FIG. 11 shows a cross sectional view of a one layer Organic Light Emitting Diode (OLED) display 240. The single level has three cells 241–243 side by side. Each cell (Pell) has a different color. Since the pells are very small the human eye sees only the color which was turned on. The other two pells which are not turned on are white or the background color. Since the background is aluminum, it appears to the human eye white. OLED display 240 is a reflective display. While it is showing that it is filled with air 250, in reality it is either evacuated or is filled with dry air. The edges are sealed off with UV curable epoxy. Before sealing, it can be either evacuated to create some vacuum or is filled with dry air. Moisture is deleterious to the operation if allowed to enter the air space. OLED display 240 is common with the other embodiments herein in that two pieces of glass are used; one glass plate has the TFT's and the metal contacts. The other glass plate has a layer of sputtered indium tin oxide (ITO). Over the ITO is evaporated OLED which may be patterned by sputtering through a mask. Over the OLED is evaporated, presumably also patterned, an aluminum electrode which also functions as a reflective surface. On top of the aluminum electrode is formed a metal conductor such as copper, nickel, and which may be overcasted with gold. Since the glass with the TFT and the conductor has either solder or gold on top, the two plates may be brought together, compressed and heated. The two conductors on repective glass plates join either by thermal compression bonding when both sides are finished with gold, or by soldering together when one side is gold and the other is a soldering type metal. The two glass parts may be fabricated separately and then they are either soldered or compression bonded together.

Figure 12:
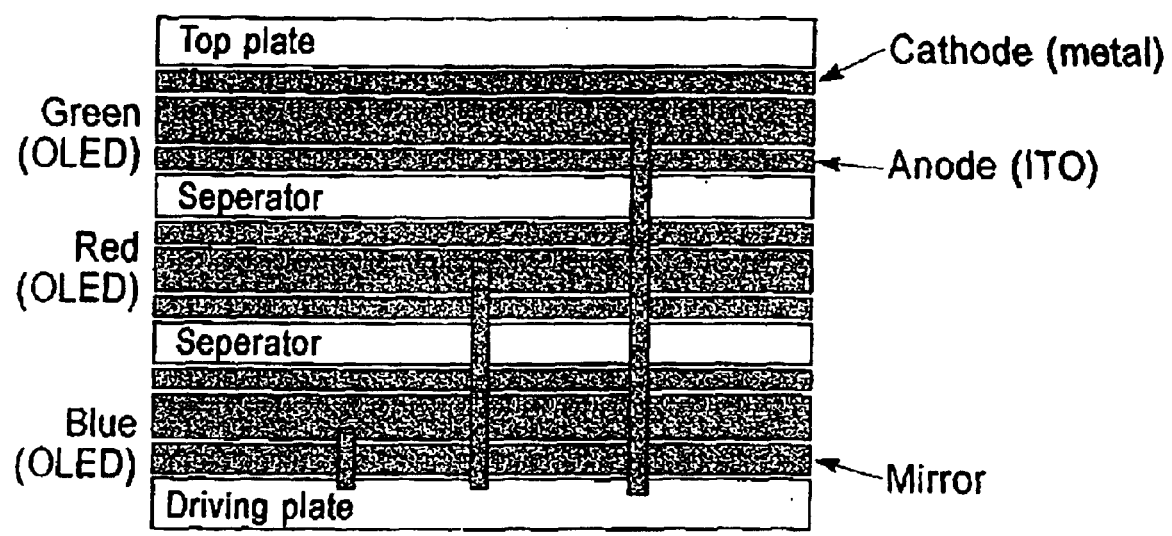
FIG. 12 is a schematic cross sectional view of a three layer Organic Light Emitting Diode (OLED) display.

FIG. 12 is a schematic cross sectional view of a three layer stacked reflective OLED display 260. The pels are on top of each other. As in a liquid crystal display, the bottom of each glass is a cathode and a common ground electrode except where the cathode is not ITO as in the liquid glass display but is very thin evaporated or sputtered metal (i.e. 100 Angstroms of aluminum or tantalum or titanium or some other metal which when it is very thin it is conductive yet it is nearly completely transparent. The cathode is evaporated with the OLED material. Each level has a different color OLED material. When not activated by a potential, the material is colorless and transparent. Therefore in reflection, one sees only the mirror, which is made of aluminum (thick) or ailver or Sn or some other white mirror material. The opposite side of the compartment of each pell has a patterned ITO anode which is connected to the metalized via like in the liquid crystal display. The TFT may activate a given pell on a given level to generate a color. When the TFT activates the bottom level, a blue color appears. If a TFT activated the ITO on the middle level, a red color is seen. The other two levels remain colorless and transparent until activated. When the TFT activates the top level, a green color appears.

The embodiment of FIG. 12 is common with the other embodiments in that each glass plate is fabricated separately, equipped with the via holes which are at least partially filled with a conducting metal or metal layers which are finished with either gold or a solder surface so that when the whole thing is aligned it can be pressed together and joined under pressure and temperature. The bottom plate called the driving plate contains prefabricated TFT devices each connected to a separate vertical via connection and terminated with an ITO patterned anode.

Having thus described our invention, what we claim as new and desire to secure by Letters Patent is:

1. A structure consisting of at least two layers of transparent dielectric containing via holes filed with a conducting material and a pattern of metal electrodes, in which the metal electrodes have at least a surface coated with a soldering metal or alloy, which soldering alloy upon alignment of patterns is joined together by heating into a structure joined together, the metal patterns on each layer forming electrodes and at the same time a spacer, which electrodes can be used to produce a display in which color cells are stacked on top of each other.

2. The structure of claim 1 including a bottom substrate containing TFT's.

3. The structure of claim 2 further including a mirror above said bottom substrate and wherein said at least two layers are transparent and said layers are in the range from 2 to 5.

4. The structure of claim 1 wherein said individual layers carry a pattern upon them and have hollow spaces, which hollow spaces can be filled with an electrophoretic fluid and be suitable to be used as a stacked pixel electrophoretic display.

5. The structure of claim 4 wherein said hollow spaces are filled with liquid crystal material and at least two of said electrodes are made of transparent ITO and thereby form a stacked liquid crystal display.

6. The display of claim 1 where said switch is directly below said respective pixel and said conductor extends from said switch vertically to said connected electrode.

7. A structure which has connections running vertically through individual transparent dielectric layers using metal filled via holes which permit to make vertical connections through individual transparent substrates from TFT's on a bottom plate to individual electrodes in at least two color cell levels, wherein said color cell levels are filled with electrophoretic fluid, each color cell level in a pixel having a fluid to provide a different fundamental color, further including metal walls in each pixel on each color cell level to provide a ground potential and a respective central electrode activated or deactivated by an applied potential from a respective TFT to collect or disperse said electrophoretic fluid.

8. A structure which has connections running vertically through individual transparent dielectric layers using metal filled via holes which permit to make vertical connections through individual transparent substrates from TFT's on a bottom plate to individual electrodes in at least two color cell levels, wherein said color cell levels are filled with electrophoretic fluid, each color cell level in a pixel having a fluid to provide a different fundamental color and further including metal walls surrounding each pixel and having holes on each side of said pixel to permit forming a meandering path for fluid whereby all pixels can be readily filled with the electrophoretic fluid or a liquid crystal (fluid) without entrapment of air bubbles at times when a vacuum is applied on one side of said structure.

9. A structure which has connections running vertically through individual transparent dielectric layers using metal filled via holes which permit to make vertical connections through individual transparent substrates from TFT's on a bottom plate to individual electrodes in at least two color cell levels, wherein said one or more color cells include hollow spaces containing said individual electrodes, said electrodes are overcoated with a layer of dielectric to permit a potential large enough to collect or disperse electrophoretic fluid without discharging particles in said fluid.

10. The structure of claim 9 wherein at least one individual electrode is made of transparent ITO and said fluid is a colored liquid crystal fluid to provide a stacked liquid crystal display.

11. The structure of claim 9 wherein at least one individual electrode is made of transparent ITO and said fluid is a colored liquid crystal fluid to provide a stacked liquid crystal display, said fluid selected to provide a display selected from the group consisting of Guest-Host LCD, Cholesteric LCD, and Holographic Polymer Dispersed LCD.

* * * * *

UNITED STATES PATENT AND TRADEMARK OFFICE
CERTIFICATE OF CORRECTION

PATENT NO. : 6,844,957 B2 Page 1 of 1
APPLICATION NO. : 09/996836
DATED : January 18, 2005
INVENTOR(S) : Keiji Matsumoto et al.

It is certified that error appears in the above-identified patent and that said Letters Patent is hereby corrected as shown below:

Column 8,
Line 12, "TV" should read -- UV --.

Column 9,
Line 13, "Snin, SnGa" should read -- SnIn, SnGa --.

Signed and Sealed this

Twenty-seventh Day of June, 2006

JON W. DUDAS
*Director of the United States Patent and Trademark Office*